(12) United States Patent
Park et al.

(10) Patent No.: US 10,826,002 B2
(45) Date of Patent: *Nov. 3, 2020

(54) DISPLAY DEVICE

(71) Applicant: SAMSUNG DISPLAY CO., LTD., Yongin-si (KR)

(72) Inventors: Gyungsoon Park, Yongin-si (KR); Ilgon Kim, Yongin-si (KR); Minjae Jeong, Yongin-si (KR)

(73) Assignee: SAMSUNG DISPLAY CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/196,024

(22) Filed: Nov. 20, 2018

(65) Prior Publication Data

US 2019/0088894 A1   Mar. 21, 2019

Related U.S. Application Data

(63) Continuation of application No. 15/384,928, filed on Dec. 20, 2016, now Pat. No. 10,135,011.

(30) Foreign Application Priority Data

Mar. 22, 2016 (KR) .................. 10-2016-0034071

(51) Int. Cl.
    *H01L 51/00* (2006.01)
    *H01L 51/52* (2006.01)
    *H01L 27/32* (2006.01)

(52) U.S. Cl.
    CPC ........ *H01L 51/0097* (2013.01); *H01L 27/326* (2013.01); *H01L 27/3218* (2013.01); *H01L 27/3248* (2013.01); *H01L 27/3272* (2013.01); *H01L 27/3293* (2013.01); *H01L 51/52* (2013.01); *H01L 51/5246* (2013.01); *H01L 51/5253* (2013.01); *H01L 51/5256* (2013.01);
    (Continued)

(58) Field of Classification Search
    None
    See application file for complete search history.

(56) References Cited

U.S. PATENT DOCUMENTS 10,121,844 B2 * 11/2018 Park .................... H01L 51/5246
10,135,011 B2 * 11/2018 Park .................... H01L 27/3218
(Continued)

FOREIGN PATENT DOCUMENTS

WO    2006129223    12/2006
WO    2008075277    6/2008

*Primary Examiner* — Shaun M Campbell

(74) *Attorney, Agent, or Firm* — F. Chau & Associates, LLC

(57) ABSTRACT

A display device including: a plurality of unit portions repeatedly arranged in a first direction and a second direction, wherein the second direction is different from the first direction; a plurality of display units respectively arranged above the plurality of unit portions; and a plurality of encapsulation layers respectively encapsulating the plurality of display units, wherein each of the plurality of unit portions includes an island where a display unit and an encapsulation layer are located, and at least one connection unit connected to the island, and islands of two unit portions adjacent to each other are spaced apart from each other, and connection units of the two unit portions adjacent to each other are connected to each other.

28 Claims, 20 Drawing Sheets

(52) U.S. Cl.
CPC .... *H01L 27/322* (2013.01); *H01L 2251/5338* (2013.01); *Y02E 10/549* (2013.01)

(56) References Cited

U.S. PATENT DOCUMENTS

| | | | |
|---|---|---|---|
| 2010/0330338 A1* | 12/2010 | Boyce | B29C 59/02 |
| | | | 428/156 |
| 2014/0117316 A1* | 5/2014 | Choi | H01L 51/5253 |
| | | | 257/40 |
| 2015/0380685 A1* | 12/2015 | Lee | H01L 51/5243 |
| | | | 257/40 |
| 2016/0049602 A1* | 2/2016 | Kim | H01L 51/0097 |
| | | | 257/40 |
| 2016/0268352 A1* | 9/2016 | Hong | H01L 27/3218 |
| 2016/0327824 A1* | 11/2016 | Chen | G02F 1/13394 |
| 2017/0125728 A1* | 5/2017 | Dighde | H01L 27/3258 |
| 2017/0279057 A1 | 9/2017 | Park et al. | |

\* cited by examiner

DISPLAY DEVICE

CROSS-REFERENCE TO RELATED APPLICATIONS

This application is a continuation of U.S. patent application Ser. No. 15/384,928 filed Dec. 20, 2016, which claims priority under 35 U.S.C. § 119 to Korean Patent Application No. 10-2016-0034071, filed on Mar. 22, 2016, in the Korean Intellectual Property Office, the disclosures of which are incorporated by reference herein in their entireties.

TECHNICAL FIELD

Exemplary embodiments of the inventive concept relate to a display device.

DESCRIPTION OF THE RELATED ART

Various flat panel display devices having excellent characteristics, such as thinness, lightness, and low power consumption, currently exist. More recently, flexible display devices that may be folded or rolled are being developed. And further, stretchable display devices capable of variously changing their shapes are being developed.

A display device that is thin and flexible may include a thin-film encapsulation layer to keep out external moisture or external oxygen. Generally, the thin-film encapsulation layer may have a structure in which inorganic films and organic films are alternately stacked on each other. However, the general thin-film encapsulation layer may be damaged when a shape of the display device is changed.

SUMMARY

According to an exemplary embodiment of the inventive concept, a display device includes: a plurality of unit portions repeatedly arranged in a first direction and a second direction, wherein the second direction is different from the first direction; a plurality of display units respectively arranged above the plurality of unit portions; and a plurality of encapsulation layers respectively encapsulating the plurality of display units, wherein each of the plurality of unit portions includes an island where a display unit and an encapsulation layer are located, and at least one connection unit connected to the island, and islands of two unit portions adjacent to each other are spaced apart from each other, and connection units of the two unit portions adjacent to each are connected to each other.

A closed curve may be formed between four unit portions adjacent to each other, and the closed curve defines an isolated region.

The isolated region may contact islands of the four unit portions.

Each of the plurality of unit portions may include four connection units, and four connection units included in one unit portion may extend in different directions to be respectively connected to four other unit portions surrounding the one unit portion.

The island and the at least one connection unit of at least one of the unit portions may include a same material.

Two unit portions adjacent to each other may be symmetrical.

In each of the unit portions the island may include at least one side surface to which the at least one connection unit is connected, and an extending direction of the at least one connection unit and the at least one side surface to which the at least one connection unit may be connected form an acute angle.

A connecting region of the at least one connection unit and the at least one side surface may include a curved surface.

The plurality of encapsulation layers may include in fluorophosphates glass, chalcogenide glass, tellurite glass, borate glass, or phosphate glass.

Each of the plurality of encapsulation layers may include a first inorganic film, a second inorganic film, and an organic film between the first and second inorganic films, and at least one of the first inorganic film and the second inorganic film may contact a side surface of the island of one of the unit portions.

The organic film may include silicon oxide containing carbon and hydrogen.

Each of the plurality of display units may include a display region and a non-display region outside the display region and a dam portion surrounding at least a part of the display region may be located in the non-display region, and the first inorganic film and the second inorganic film may cover the dam portion and contact each other outside the dam portion.

The second inorganic film may extend above the at least one connection unit.

A flexure portion may be partially formed above the at least one connection unit.

Each of the plurality of display units may include a thin-film transistor including at least one inorganic layer, a display element electrically connected to the thin-film transistor, and a passivation layer between the thin-film transistor and the display element, and the at least one inorganic layer and the passivation layer may extend above the at least one connection unit.

The passivation layer extending above the at least one connection unit may include a disconnection region that exposes the at least one inorganic layer, and at least one of the first inorganic film and the second inorganic film may contact the at least one inorganic layer through the disconnection region.

The at least one connection unit may include a pair of first connection units that are located opposite to each other and extend in a direction parallel to the first direction, and a pair of second connection units that are located opposite to each other and extend in a direction parallel to the second direction, a first wiring portion may be located above the pair of first connection units and a second wiring portion may be located above the pair of second connection units, and the first wiring portion and the second wiring portion may cross each other above the island of one of the unit portions.

The first wiring portion and the second wiring portion may include a same material.

Each of the plurality of display units may include a display element and a thin-film transistor electrically connected to the display element, the thin-film transistor may include an active layer, a gate electrode, a source electrode, and a drain electrode, and the source electrode, the drain electrode, the first wiring portion, and the second wiring portion may include a same material.

The first wiring portion may include a first voltage line, a second voltage line, and at least one data line, and the second wiring portion may include at least one scan line.

Each of the plurality of display units may include a display element including a first electrode, a second electrode, and an intermediate layer including an organic emission layer between the first and second electrodes, the first voltage line may electrically connect first electrodes respectively included in the plurality of display units and separated from each other to each other, and the second voltage line may electrically connect second electrodes respectively included in the plurality of display units and separated from each other to each other.

Each of the plurality of display units may include a display element and a thin-film transistor electrically connected to the display element, the thin-film transistor may include an active layer, a gate electrode, a source electrode, and a drain electrode, and the display element may include a first electrode, a second electrode, and an intermediate layer including an organic emission layer between the first and second electrodes, the first electrode may extend from the source electrode or the drain electrode, and each of the plurality of display units may further include a color filter that is disposed between the first electrode and the island of one of the unit portions and include a region overlapping the first electrode.

According to an exemplary embodiment of the inventive concept, a flexible display device includes: a substrate; a plurality of display units spaced apart from each other above the substrate; and a plurality of encapsulation layers each encapsulating one of the plurality of display units, wherein the substrate includes a plurality of islands spaced apart from each other, a plurality of connection units connecting the plurality of islands, and a plurality of penetration portions penetrating the substrate between the plurality of connection units, each of the plurality of display units is disposed above a corresponding one of the plurality of islands, and wiring portions electrically connecting the plurality of display units are located above the plurality of connection units.

The plurality of islands and the plurality of connection units may be integrally formed.

Each of the plurality of encapsulation layers may include a first inorganic film, a second inorganic film, and an organic film between the first and second inorganic films, and at least one of the first inorganic film and the second inorganic film may contact a side surface of a corresponding one of the plurality of islands.

The second inorganic film may extend above the plurality of connection units.

A flexure portion may be formed at least partly above the plurality of connection units.

Each of the plurality of display units may include a thin-film transistor including at least one inorganic layer, a display element electrically connected to the thin-film transistor, and a passivation layer between the thin-film transistor and the display element, and the at least one inorganic layer and the passivation layer may extend above the plurality of connection units.

The passivation layer above the plurality of connection units may include a disconnection region exposing the at least one inorganic layer, and at least one of the first inorganic film and the second inorganic film may contact the at least one inorganic layer through the disconnection region.

The disconnection region may cross the plurality of connection units in a width direction of the plurality of connection units.

Each of the plurality of display units may include a display region and a non-display region outside the display region, wherein a dam portion surrounding at least a part of the display region may be located in the non-display region, and the first inorganic film and the second inorganic film may cover the dam portion and contact each other beyond the dam portion.

The plurality of islands may be repeatedly arranged along a first direction and a second direction different from the first direction to form a lattice pattern, four connection units may be connected to each of the plurality of islands, and the four connection units connected to one island may extend in different directions to be respectively connected to four other islands near the one island.

The four connection units may include a pair of first connection units located opposite to each other and extending parallel to the first direction, and a pair of second connection units located opposite to each other and extending parallel to the second direction, the wiring portions may include a first wiring portion located above the pair of first connection units and a second wiring portion located above the pair of second connection units, and the first wiring portion and the second wiring portion may cross each other above the plurality of islands.

The first wiring portion may include a region protruding and curved in a direction parallel to the second direction around the plurality of penetration portions, and the second wiring portion may include a region protruding and curved in a direction parallel to the first direction around the plurality of penetration portions.

Each of the plurality of display units may include a display element and a thin-film transistor electrically connected to the display element, the thin-film transistor may include an active layer, a gate electrode, a source electrode, and a drain electrode, and the source electrode, the drain electrode, the first wiring portion, and the second wiring portion may include a same material.

The first wiring portion may include a first voltage line, a second voltage line, and at least one data line, and the second wiring portion may include at least one scan line.

Each of the plurality of display units may include a display element, wherein the display element may include a first electrode, a second electrode, and an intermediate layer including an organic emission layer between the first and second electrodes, the first voltage line may electrically connect first electrodes included in the plurality of display units and separated from each other to each other, and the second voltage line may electrically connect second electrodes included in the plurality of display units and separated from each other to each other.

Two islands adjacent to each other may be connected by one connection unit, and side surfaces of the two islands connected by the one connection unit and an extending direction of the one connection unit may form an acute angle.

Each of the plurality of islands may have a rectangular shape, and corner portions of the rectangular shape may face the first direction and the second direction.

The flexible display device may further include a first protection film and a second protection film respectively disposed above a top surface and a bottom surface of the substrate.

According to an exemplary embodiment of the inventive concept, a display device includes: a plurality of unit portions arranged in a matrix, wherein at least one of the unit portions includes: an island; a plurality of connecting units connected to sides of the island; a display unit disposed on the island; and an encapsulating unit overlapping the display unit and the island, wherein an open space is disposed between two adjacent unit portions formed in a column, wherein a connecting unit connecting the two adjacent unit portions is a side of the open space.

BRIEF DESCRIPTION OF THE DRAWINGS

The above and/or other features of the inventive concept will become more apparent by describing in detail exemplary embodiments thereof, with reference to the accompanying drawings in which.

DETAILED DESCRIPTION OF THE EMBODIMENTS

Figure 1:
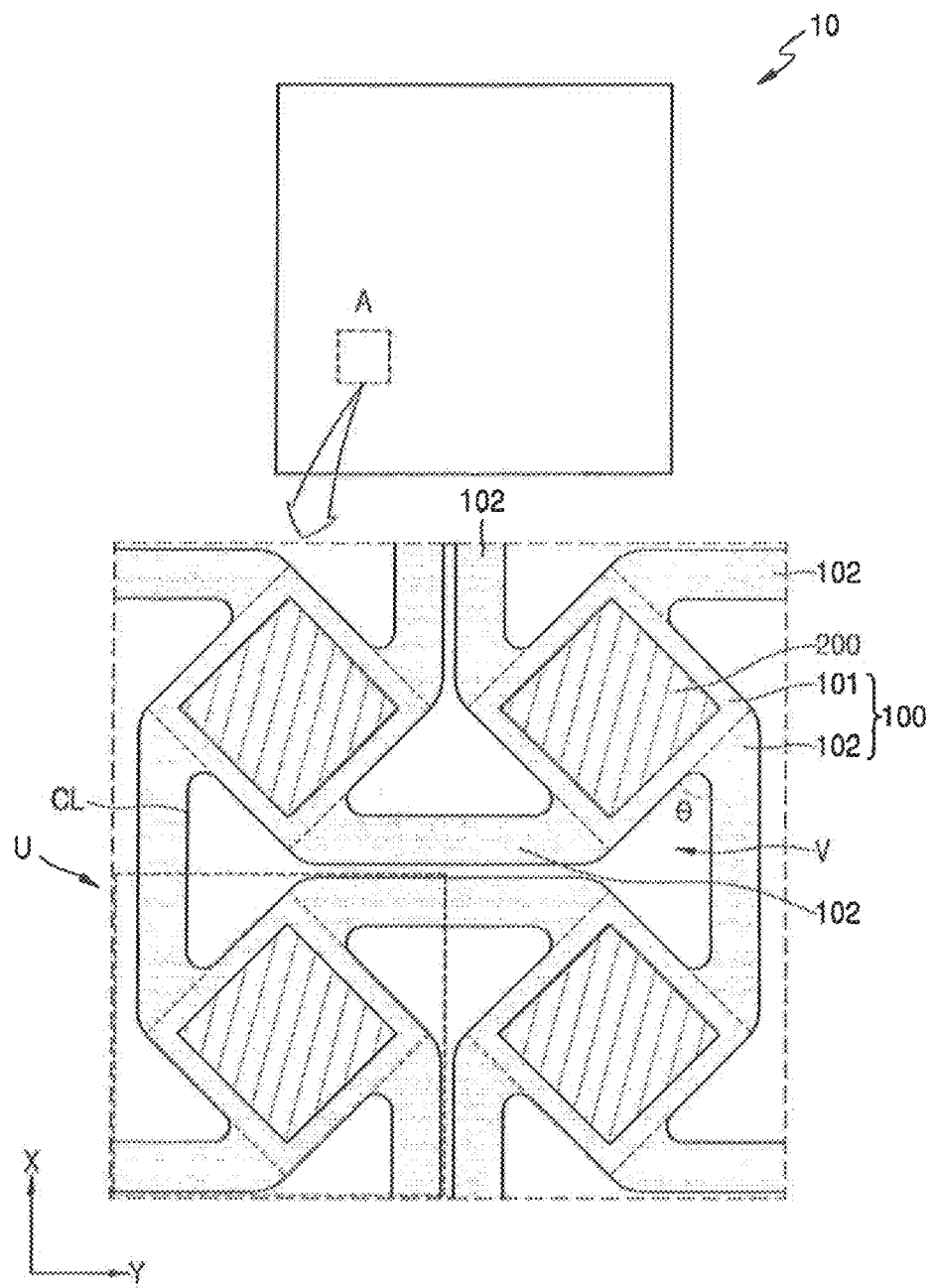
FIG. 1 is a plan view schematically illustrating a display device according to an exemplary embodiment of the inventive concept.

Exemplary embodiments of the inventive concept will now be described with reference to the accompanying drawings. This inventive concept may, however, be embodied in many different forms and should not be construed as being limited to the embodiments set forth herein.

An expression used in the singular encompasses the expression in the plural, unless it has a clearly different meaning in the context. In drawings, for convenience of description, sizes of components may be exaggerated for clarity.

In drawings, like reference numerals may refer to like elements throughout and overlapping descriptions shall not be repeated.

Figure 2:
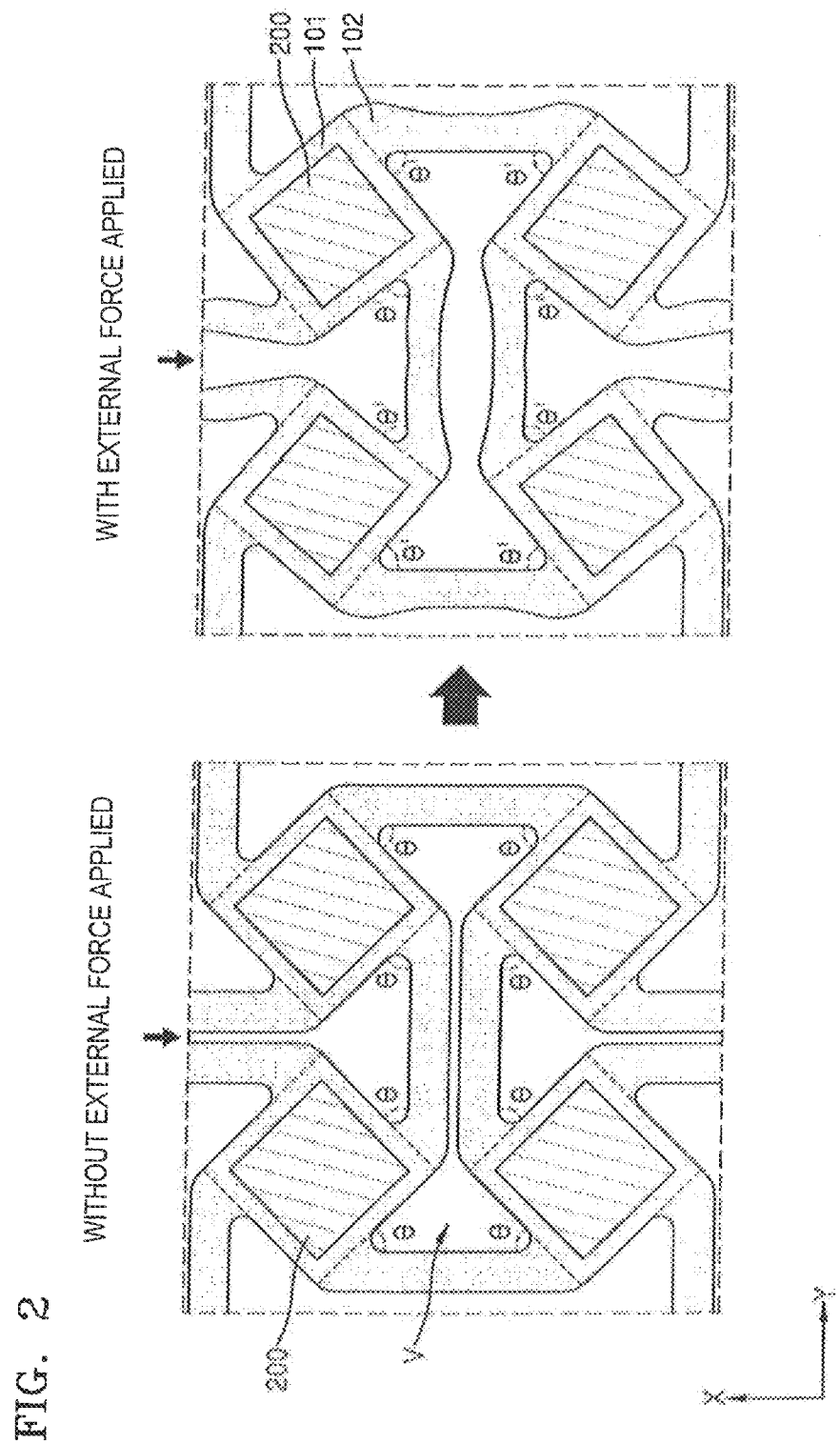
FIG. 2 is an enlarged plan view of a region A of FIG. 1, according to an exemplary embodiment of the inventive concept.

FIG. 1 is a plan view schematically illustrating a display device 10 according to an exemplary embodiment of the inventive concept, and FIG. 2 is an enlarged plan view of a region A of FIG. 1, according to an exemplary embodiment of the inventive concept.

Referring to FIG. 1, the display device 10 according to an exemplary embodiment of the inventive concept may include a substrate 100 and display units 200 above the substrate 100.

The substrate 100 may include various materials. For example, the substrate 100 may be formed of glass, a metal, or an organic material.

According to an exemplary embodiment of the inventive concept, the substrate 100 may be formed of a flexible material. For example, the substrate 100 may be formed of a material that is twistable, bendable, foldable, or rollable. The flexible material forming the substrate 100 may be ultra-thin glass, a metal, or plastic. When the substrate 100 includes plastic, the substrate 100 may contain polyimide (PI). As another example, the substrate 100 may contain another type of plastic.

The substrate 100 may include a plurality of islands 101 that are spaced apart from each other, a plurality of connection units 102 connecting the plurality of islands 101, and a plurality of penetration portions V penetrating through the substrate 100 between the plurality of connection units 102. As will be described later with reference to FIG. 18, first and second protection films 410 and 420 may be provided respectively at the top and bottom of the substrate 100.

The plurality of islands 101 may be spaced apart from each other. For example, the plurality of islands 101 may be repeatedly arranged along a first direction X and a second direction Y different from the first direction X to form a plane lattice pattern. For example, the first and second directions X and Y may cross at right angles. As another example, the first and second directions X and Y may form an obtuse angle or an acute angle.

The plurality of display units 200 may be respectively disposed above the plurality of islands 101. An individual display unit 200 may include at least a display element to realize visible light. The individual display unit 200 will be described later with reference to FIG. 4.

The plurality of connection units 102 may connect the plurality of islands 101 to each other. For example, four connection units 102 are connected to each of the plurality of islands 101. The four connection units 102 connected to one island 101 may extend in different directions to be respectively connected to four other islands 101 surrounding the one island 101. The plurality of islands 101 and the plurality of connection units 102 may be formed continuously and of the same material. In other words, the plurality of islands 101 and the plurality of connection units 102 may be integrally formed.

The penetration portions V are formed to penetrate through the substrate 100. An individual penetration portion V may provide an isolated region between the plurality of islands 101, reduce a weight of the substrate 100, and increase flexibility of the substrate 100. In addition, shapes of the penetration portions V change when the substrate 100 is twisted, bent, or rolled so as to reduce stress that is generated when the substrate 100 is deformed, thereby preventing abnormal deformation of the substrate 100 and increasing durability of the substrate 100. Accordingly, user convenience increases when the display device 10 is used, and in particular, the display device 10 may be easily applied to a wearable device.

The penetration portion V may be formed by removing one region of the substrate 100 via etching, or the substrate 100 may be manufactured to include the penetration portion V. A process of forming the penetration portion V may vary and is not limited.

Hereinafter, a unit portion U that is a basic unit of forming the substrate 100 and a structure of the substrate 100 will be described by using the unit portion U.

The unit portions U may be repeatedly arranged along the first direction X and the second direction Y. In other words, the substrate 100 may be formed as a plurality of the unit portions U that are repeatedly arranged along the first and second directions X and Y are combined with each other. The unit portion U may include the island 101 and at least one connection unit 102 connected to the island 101. Four connection units 102 may be connected to one island 101.

The islands 101 of two adjacent unit portions U may be spaced apart from each other, and the connection units 102 of the two adjacent unit portions U may be connected to each other. Here, the connection unit 102 included in the unit portion U may denote a partial region of the connection unit 102 located within a region of the unit portion U or the entire connection unit 102 connecting two neighboring islands 101.

Four adjacent unit portions U from among the plurality of unit portions U form a closed curve CL therebetween, and the closed curve CL may define an isolated region, e.g., an empty space. The isolated region may be the penetration portion V. The isolated region is a region formed by removing one region of the substrate 100, and may increase flexibility of the substrate 100 and reduce stress that is generated when the substrate 100 is deformed. In addition, the connection unit 102 may have a width smaller than the island 101, and accordingly, the isolated region may also contact the islands 101 of the four adjacent unit portions U.

Two adjacent unit portions U from among the plurality of unit portions U may be symmetrical. For example, as shown in FIG. 1, one unit portion U may be symmetrical to another unit portion U arranged adjacent to the one unit portion U along the second direction Y based on an axis of symmetry parallel to the first direction X. In addition, the one unit portion U may be symmetrical to another unit portion U arranged adjacent to the one unit portion U along the first direction X based on an axis of symmetry parallel to the second direction Y.

In addition, an angle θ between an extending direction of the connection unit 102 and a side surface of the island 101 to which the connection unit 102 is connected may be an acute angle. For example, when the island 101 has a rectangular shape and corner portions of the rectangular shape are arranged to face the first and second directions X and Y, the connection units 102 may be connected to the island 101 in regions adjacent to the corner portions and may extend in a direction parallel to the second direction Y or the first direction X. In other words, the connection unit 102 connected to the corner portion facing the first direction X faces the second direction Y or a − second direction −Y, and the connection unit 102 connected to the corner portion facing the second direction Y may face the first direction X or a − first direction −X. Accordingly, each of side surfaces of two adjacent islands 101 connected to one connection unit 102 and an extending direction of the one connection unit 102 may form an acute angle, and thus the islands 101 may be densely arranged and lengths of the connection units 102 may be reduced, thereby increasing an area of the isolated region. In addition, as shown in FIG. 2, the substrate 100 may have an elongation property.

FIG. 2 illustrates a shape when the substrate 100 is stretched along the first and second directions X and Y. Referring to FIG. 2, when an external force is applied to the substrate 100, the angle θ between the extending direction of the connection unit 102 and the side surface of the island 101 to which the connection unit 102 is connected increases to an angle θ', and accordingly, an area of the isolated region may increase. Accordingly, intervals between the islands 101 increase and the substrate 100 is stretched along the first and second directions X and Y such that a shape of the substrate 100 is changed in 2-dimensions (2D) or 3-dimensions (3D).

In addition, since the connection unit 102 has a width smaller than the island 101, a shape change for increasing the angle θ when the external force is applied to the substrate 100 appears mainly in the connection unit 102, and a shape of the island 101 may not change when the substrate 100 is elongated. Accordingly, the display unit 200 disposed above the island 101 is stably maintained when the substrate 100 is stretched, and thus the display device 10 may be easily applied to a display device that requires flexibility, such as a bending display device, a flexible display device, or a stretchable display device.

In addition, stress that is generated when the substrate 100 is elongated is concentrated on a connection region of the connection unit 102 connected to the side surface of the island 101, and thus the connecting region of the connection unit 102 may include a curved surface to prevent the connection unit 102 from being torn due to concentration of the stress.

Figure 3:
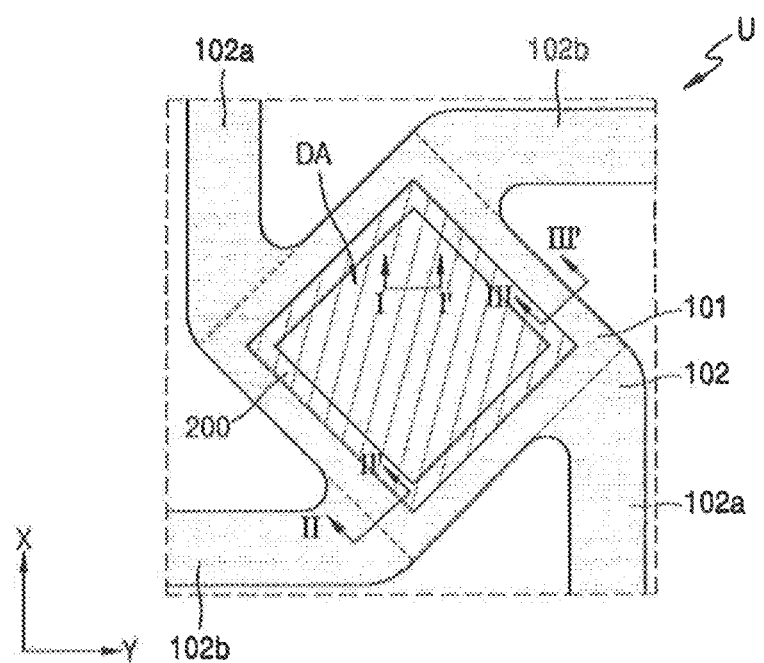
FIG. 3 is a plan view of a unit portion of FIG. 1 according to an exemplary embodiment of the inventive concept.
Figure 4:
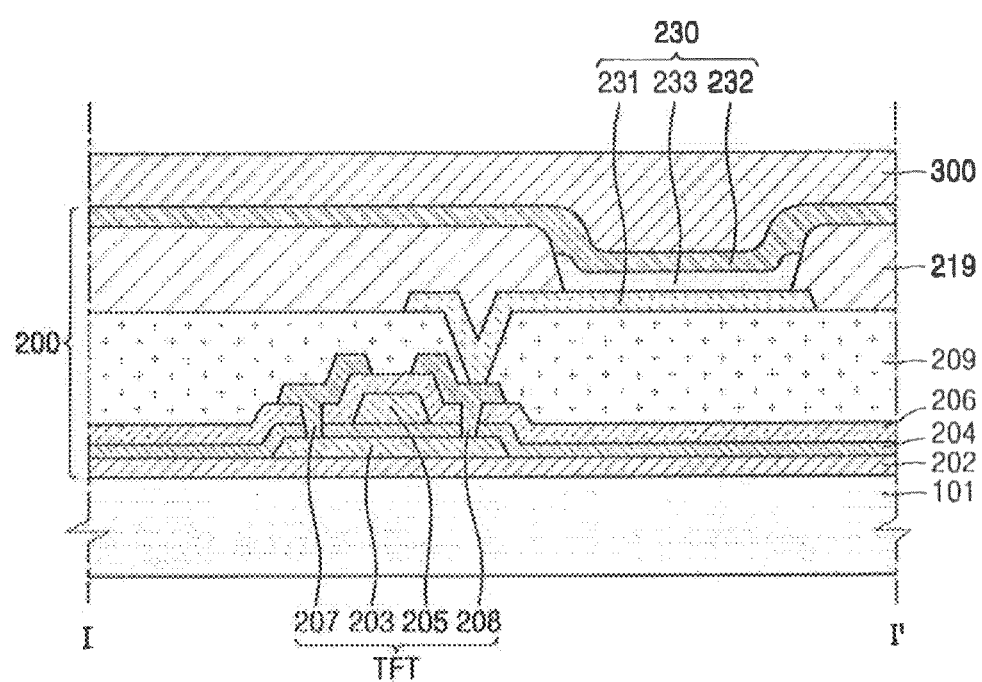
FIG. 4 is a cross-sectional view taken along a line I-I' of FIG. 3, according to an exemplary embodiment of the inventive concept.
Figure 5:
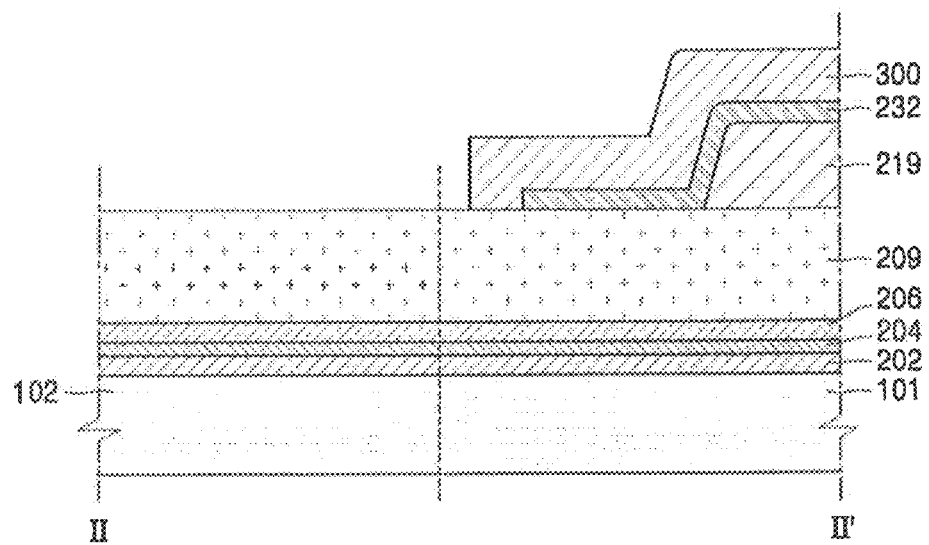
FIG. 5 is a cross-sectional view taken along a line II-II' of FIG. 3, according to an exemplary embodiment of the inventive concept.
Figure 6:
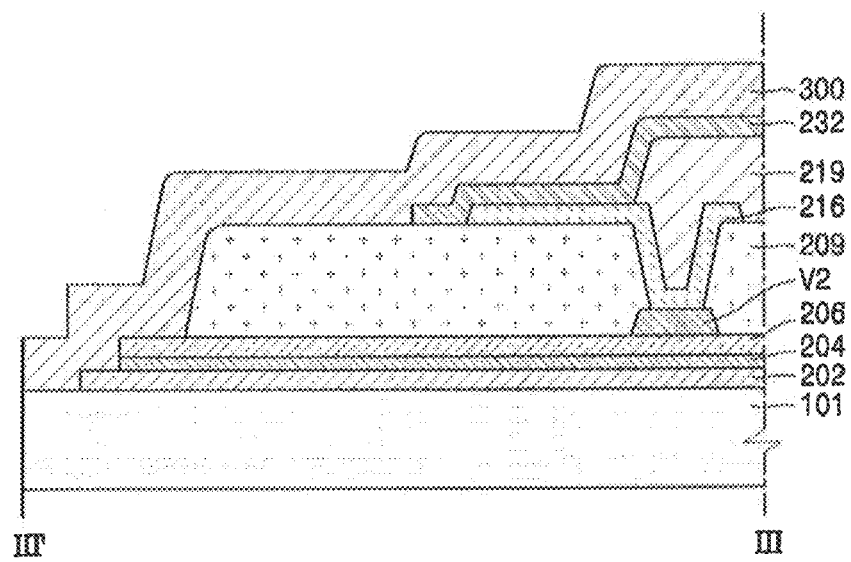
FIG. 6 is a cross-sectional view taken along a line of FIG. 3, according to an exemplary embodiment of the inventive concept.

FIG. 3 is a plan view of the unit portion U of FIG. 1 according to an exemplary embodiment of the inventive concept, FIG. 4 is a cross-sectional view taken along a line I-I' of FIG. 3, according to an exemplary embodiment of the inventive concept, FIG. 5 is a cross-sectional view taken along a line II-II' of FIG. 3, according to an exemplary embodiment of the inventive concept, and FIG. 6 is a cross-sectional view taken along a line III-III' of FIG. 3, according to an exemplary embodiment of the inventive concept.

Referring to FIGS. 3 through 6, the display unit 200 and an encapsulation layer 300 encapsulating the display unit 200 may be located in the island 101 of the unit portion U, and the connection unit 102 may include a pair of first connection units 102a located opposite to each other and extending in a direction parallel to the first direction X, and a pair of second connection units 102b located opposite to each other and extending in a direction parallel to the second direction Y.

The display unit 200 is located on the island 101, and may include a display region DA and a non-display region around the display region DA. At least one organic light-emitting diode (OLED) 230 for emitting red light, blue light, green light, or white light may be located in the display region DA, and the OLED 230 may be electrically connected to a thin-film transistor TFT. In other words, in the current embodiment, the OLED 230 is used as a display element. However, the inventive concept is not limited thereto, and the display unit 200 may include any type of display element, such as a liquid crystal device.

Each of the display units 200 may include one OLED 230 for emitting red, blue, green, or white light and form a sub-pixel. As another example, each of the display units 200 may include a plurality of the OLEDs 230 for emitting different colors of light. For example, one display unit 200 may include the OLED 230 for emitting red light, the OLED 230 for emitting green light, and the OLED 230 for emitting blue light to form one pixel. As another example, the display unit 200 may include a plurality of pixels.

In addition, the OLEDs 230 in the display unit 200 may be disposed in any one of various arrangements, such as an RBG structure, a pentile structure, and a honeycomb structure. Such arrangement may depend on the efficiency of materials included in an organic emission layer.

Referring to FIG. 4, a buffer layer 202 may be formed over the island 101. For example, the buffer layer 202 may contain an inorganic material, such as silicon oxide, silicon nitride, silicon oxynitride, aluminum oxide, aluminum nitride, titanium oxide, or titanium nitride, or an organic material, such as polyimide, polyester, or acryl. Further, the buffer layer 202 may include a plurality of structures formed of the aforementioned materials.

The thin-film transistor TFT may include an active layer 203, a gate electrode 205, a source electrode 207, and a drain electrode 208. Hereinafter, it is assumed that the thin-film transistor TFT is a top gate type in which the active layer 203, the gate electrode 205, the source electrode 207, and the drain electrode 208 are sequentially formed. However, the inventive concept is not limited thereto, and the thin-film transistor TFT may be any type, such as a bottom gate type.

The active layer 203 may include a semiconductor material, for example, amorphous silicon or polycrystalline silicon. However, the inventive concept is not limited thereto, and the active layer 203 may contain various materials. According to an exemplary embodiment of the inventive concept, the active layer 203 may contain an organic semiconductor material. According to an exemplary embodiment of the inventive concept, the active layer 203 may contain an oxide semiconductor material. For example, the active layer 203 may include an oxide of a material from among 12, 13, and 14-group metal elements, such as zinc (Zn), indium (In), gallium (Ga), tin (Sn), cadmium (Cd), and germanium (Ge), and a combination thereof.

A gate insulating layer 204 is formed above the active layer 203. The gate insulating layer 204 may be a multilayer or a single layer of a film formed of an inorganic material, such as silicon oxide and/or silicon nitride. The gate insulating layer 204 insulates the active layer 203 and the gate electrode 205.

The gate electrode 205 is formed over the gate insulating layer 204. The gate electrode 205 may be connected to a gate line for applying an on/off signal to the thin-film transistor TFT. The gate electrode 205 may be formed of a low-resistance metal material. The gate electrode 205 may be a multilayer or a single layer formed of at least one material from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer insulating layer 206 is formed over the gate electrode 205. The interlayer insulating layer 206 insulates the source and drain electrodes 207 and 208 and the gate electrode 205. The interlayer insulating layer 206 may be a multilayer or a single layer of a film formed of an inorganic material. For example, the inorganic material may be a metal oxide or a metal nitride. Examples of the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZrO2).

The source electrode 207 and the drain electrode 208 are formed over the interlayer insulating layer 206. The source and drain electrodes 207 and 208 may each be a single layer or a multilayer of at least one material from among Al, Pt, Pd, Ag, Mg, Au, Ni, Nd, Ir, Cr, Li, Ca, Mo, Ti, W, and Cu. The source and drain electrodes 207 and 208 are formed to contact a region of the active layer 203.

A passivation layer 209 may be formed to cover the thin-film transistor TFT. The passivation layer 209 removes a stepped portion generated by the thin-film transistor TFT and flattens a top surface of the thin-film transistor TFT, thereby preventing the OLED 230 from being defected by unevenness.

The passivation layer 209 may be a single layer or a multilayer of a film formed of an organic material. Examples of the organic material include general-purpose polymers, such as polymethylmethacrylate (PMMA) and polystylene (PS), polymer derivatives having a phenol-based group, acryl-based polymers, imide-based polymers, arylether-based polymers, amide-based polymers, fluoride-based polymers, p-xylen-based polymers, vinyl alcohol-based polymers, and blends thereof. Alternatively, the passivation layer 209 may be a complex stacked structure of an inorganic insulating film and an organic insulating film.

The OLED 230 is formed over the passivation layer 209. The OLED 230 may include a first electrode 231, a second electrode 232 facing the first electrode 231, and an intermediate layer 233 disposed between the first and second electrodes 231 and 232.

The first electrode 231 may be electrically connected to the source or drain electrode 207 or 208. The first electrode 231 may have any one of various shapes, for example, the first electrode 231 may be patterned in an island shape.

The first electrode 231 is formed over the passivation layer 209 and may be electrically connected to the thin-film transistor TFT through a contact hole formed in the passivation layer 209. The first electrode 231 may be, for example, a reflective electrode. For example, the first electrode 231 may include a reflective film formed of Ag, Mg, Al, Pt, Pd, Au, Ni, Nd, Ir, Cr, or a compound thereof, and a transmissive electrode layer formed on the reflective film. The transmissive electrode layer may include at least one from among indium tin oxide (ITO), indium zinc oxide (IZO), zinc oxide (ZnO), indium oxide ($In_2O_3$), indium gallium oxide (IGO) and aluminum zinc oxide (AZO).

The second electrode 232 facing the first electrode 231 may have any one of various shapes, and for example, may be patterned in an island shape. The second electrode 232 may be a transmissive electrode. The second electrode 232 may be a thin film formed of a metal having a low work function, such as Li, Ca, LIF/Ca, LiF/Al, Al, Ag, Mg, or a compound thereof. In addition, an auxiliary electrode layer or a bus electrode may be further formed on the thin film by using ITO, IZO, ZnO, or $In_2O_3$. Accordingly, the second electrode 232 may transmit light emitted from an organic emission layer included in the intermediate layer 233. In other words, light emitted from the organic emission layer may be emitted towards the second electrode 232 directly or by being reflected at the first electrode 231 that is a reflective electrode.

However, the display unit 200 according to the current embodiment is not limited to the top emission type, and may be a bottom emission type in which light emitted from the organic emission layer is emitted towards the island 101. In this case, the first electrode 231 may be a transmissive electrode and the second electrode 232 may be a reflective electrode. Alternatively, the display unit 200 according to the current embodiment may be a dual emission type in which light is emitted in both front and rear directions.

In addition, a pixel defining layer 219 is formed over the first electrode 231 by using an insulating material. The pixel defining layer 219 may be formed via a spin-coating method by using at least one organic insulating material from among polyimide, polyamide, acryl resin, benzocyclobuten, and phenol resin. The pixel defining layer 219 exposes a certain region of the first electrode 231, and the intermediate layer 233 including the organic emission layer is located in the exposed region. In other words, the pixel defining layer 219 defines a pixel region of the OLED 230.

The organic emission layer included in the intermediate layer 233 may be formed of a low-molecular organic material or a polymer organic material, and the intermediate layer 233 may selectively further include, in addition to the organic emission layer, a functional layer, such as a hole transport layer (HTL), a hole injection layer (HIL), an electron transport layer (ETL), and an electron injection layer (EIL).

The encapsulation layer 300 encapsulating the display unit 200 may be formed over the second electrode 232. The encapsulation layer 300 may be a single layer or a multilayer and may block external oxygen and moisture.

For example, the encapsulation layer 300 may be formed of a low temperature viscosity transition (LVT) inorganic material. Here, a viscosity transition temperature is a lowest temperature capable of providing fluidity to a viscosity transition inorganic material and may be lower than a denaturalization temperature of a material included in the OLE© 230.

The LVT inorganic material may be, for example, a low liquidus temperature (LLT) material having a glass transition temperature less than or equal to 200° C. For example, the LLT material may include at least one of tin fluorophosphates glass, chalcogenide glass, tellurite glass, borate glass, and phosphate glass.

For example, tin fluorophosphates glass may include 20 to 80 wt % of tin (Sn), 2 to 20 wt % of phosphorous (P), 3 to 20 wt % of oxygen (O), and 10 to 36 wt % of fluoride (F), but is not limited thereto. The glass materials described above may further include tungsten (W). When tungsten is added to a glass material, stable and homogeneous glass is manufactured, and thus chemical durability of the encapsulation layer 300 may increase.

In addition, the LVT inorganic material may include tin oxide, such as SnO or $SnO_2$. For example, when the LVT inorganic material includes SnO, an amount of SnO may be 20 to 100 wt %.

The LVT inorganic material including tin oxide may further include at least one of phosphorous oxide (for example, $P_2O_5$), boron phosphate ($BPO_4$), tin fluoride (for example, $SnF_2$), niobium oxide (for example, NbO), and tungsten oxide (for example, $WO_3$).

For example, the LVT inorganic material may include: SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$, but is not limited thereto.

In addition, the LVT inorganic material may have one of the following compositions, but is not limited thereto.
1) SnO (100 wt %);
2) SnO (80 wt %) and $P_2O_5$ (20 wt %);
3) SnO (90 wt %) and $BPO_4$ (10 wt %);
4) SnO (20 to 50 wt %), $SnF_2$ (30 to 60 wt %), and $P_2O_5$ (10 to 30 wt %) (here, a sum of weights of SnO, $SnF_2$, and $P_2O_5$ is 100 wt %);
5) SnO (20 to 50 wt %), $SnF_2$ (30 to 60 wt %), $P_2O_5$ (10 to 30 wt %), and NbO (1 to 5 wt %) (here, a sum of weights of SnO, $SnF_2$, $P_2O_5$, and NbO is 100 wt %);
6) SnO (20 to 50 wt %), $SnF_2$ (30 to 60 wt %), $P_2O_5$ (10 to 30 wt %), and $WO_3$ (1 to 5 wt %) (here, a sum of weights of SnO, $SnF_2$, $P_2O_5$, and $WO_3$ is 100 wt %).

The encapsulation layer 300 may be formed of a glass material, and thus may effectively prevent penetration of external moisture and oxygen when the encapsulation layer 300 is not formed of a plurality of layers.

As shown in FIGS. 5 and 6, the encapsulation layer 300 may be formed only over the island 101. In other words, the encapsulation layer 300 may be formed over each of the islands 101 to separately seal the display units 200. Accordingly, the encapsulation layer 300 is prevented from being damaged by cracking or the like when the display device 10 is elongated or when the shape of the display device 10 is changed via twisting, bending, or rolling, and thus reliability of the display device 10 may be increased and flexibility of the display device 10 may increase.

In addition, a wiring portion, such as a second voltage line V2 may be located in the non-display region of the display unit 200. The wiring portion may be formed of the same material as the source and drain electrodes 207 and 208, and will be described later with reference to FIGS. 14 and 15. In addition, in FIG. 6, the second voltage line V2 and the second electrode 232 are connected to each other through a connection wire 216, but the inventive concept is not limited thereto, and the second voltage line V2 and the second electrode 232 may directly contact each other.

Figure 7:
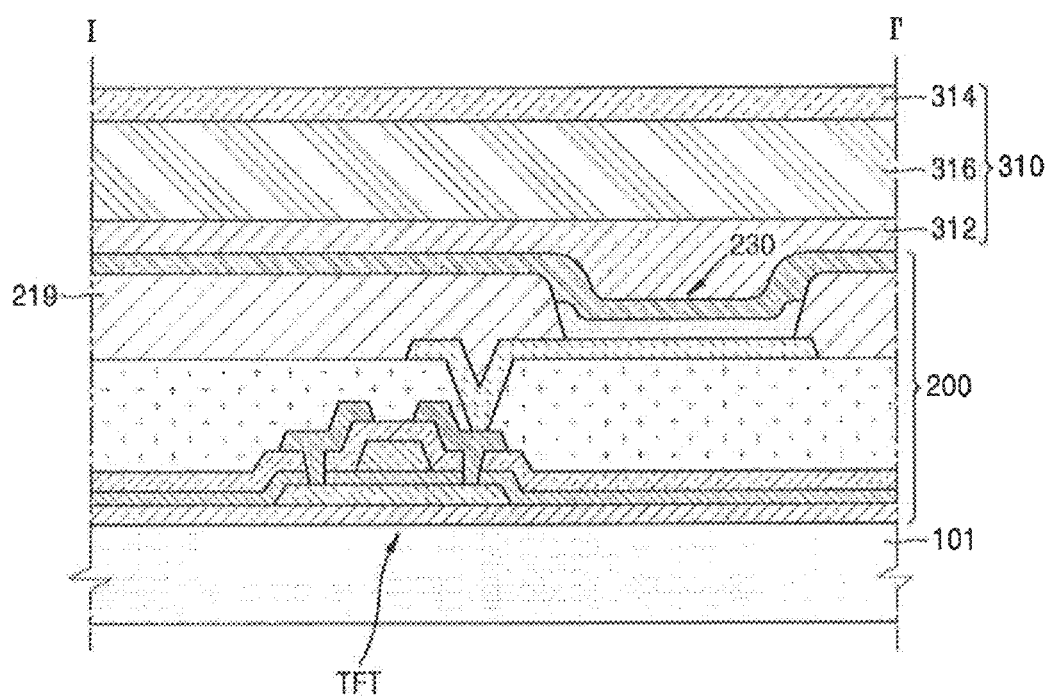
FIG. 7 is a cross-sectional view taken along the line I-I' of FIG. 3, according to an exemplary embodiment of the inventive concept.
Figure 8:
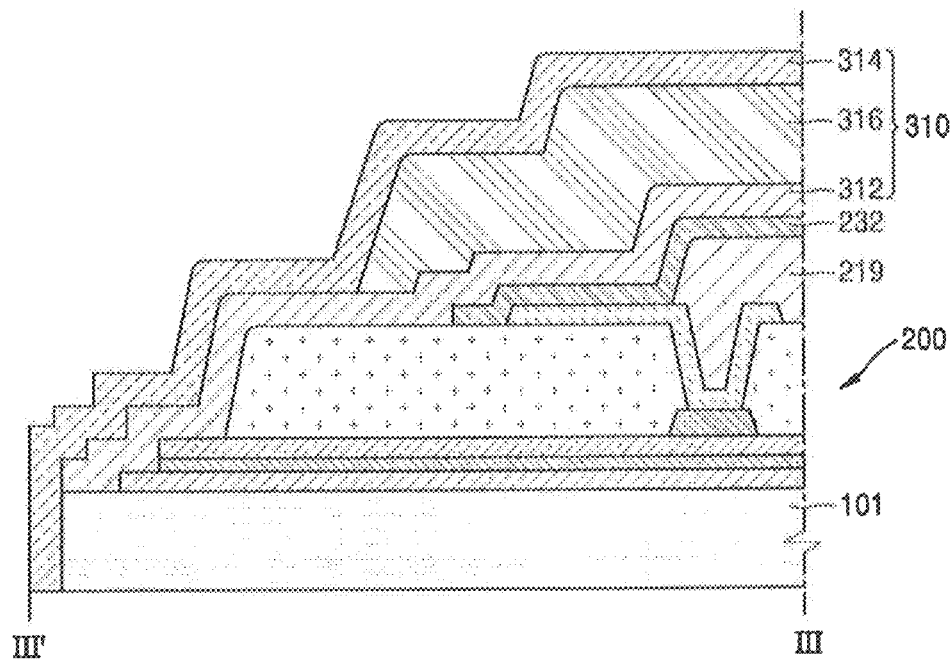
FIG. 8 is a cross-sectional view taken along the line II-II' of FIG. 3, according to an exemplary embodiment of the inventive concept.

FIG. 7 is a cross-sectional view taken along the line I-I' of FIG. 3, according to an exemplary embodiment of the inventive concept, and FIG. 8 is a cross-sectional view taken along the line II-II' of FIG. 3, according to an exemplary embodiment of the inventive concept.

Referring to FIGS. 7 and 8 together with FIG. 3, the display unit 200 and an encapsulation layer 310 are located over the island 101. The display unit 200 may include at least one OLED 230 and the thin-film transistor TFT electrically connected to the OLED 230. Since the island 101 and the display unit 200 are the same as those described above with reference to FIGS. 1 through 6, details thereof are not provided again and only differences will be described.

The encapsulation layer 310 may be formed over each island 101 to seal each display unit 200.

The encapsulation layer 310 may include, for example, first and second inorganic films 312 and 314 and an organic film 316, which are alternately stacked on each other. In FIGS. 7 and 8, the encapsulation layer 310 includes two inorganic films, e.g., the first and second inorganic films 312 and 314 and one organic film 316, but the inventive concept is not limited thereto. In other words, the encapsulation layer 310 may further include additional numbers of organic films and inorganic films that are alternately stacked, and the number of times the inorganic and organic films are stacked on each other is not limited.

According to an exemplary embodiment of the inventive concept, the inorganic films 312 and 314 may include at least one material from among silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The organic film 316 may flatten a stepped portion formed by the pixel defining layer 219, and reduce stress that is generated in the first and second inorganic films 312 and 314. According to an exemplary embodiment of the inventive concept, the organic film 316 may include polymethylmetacrylate (PMMA), polycarbonate (PC), polystyrene (PS), acryl-based resin, epoxy-based resin, polyimide, or polyethylene.

According to an exemplary embodiment of the inventive concept, the organic film 316 may be formed by using silicon oxide containing carbon and hydrogen (hereinafter, referred to as SiOCH). For example, the organic film 316 may be formed of a material having a formula of $SiO_xC_yH_z$.

When the organic film 316 is formed of SiOCH, the organic film 316 may be formed by depositing a precursor film on the first inorganic film 312 via plasma-enhanced chemical vapor deposition (PECVD) by using a raw material gas, such as hexamethyldisiloxane, and a reaction gas, such as oxygen, and then hardening the precursor film. Accordingly, a time taken to form the encapsulation layer 310 may be reduced since the organic film 316 and the first and second inorganic films 312 and 314 may be formed via the same method in the same chamber.

According to an exemplary embodiment of the inventive concept, at least one of the first and second inorganic films 312 and 314 may include SiOCH. For example, at least one of the first and second inorganic films 312 and 314 may be formed of a material having a formula of $SiO_xC_yH_z$.

In addition, when at least one of the first and second inorganic films 312 and 314 and the organic film 316 are formed of SiOCH, SiOCH forming the at least one of the first and second inorganic films 312 and 314 and SiOCH forming the organic film 316 may have different composition ratios. For example, a film formed of SiOCH has properties of an inorganic film when a content ratio of oxygen increases and a content ratio of carbon decreases, and thus the content of oxygen included in SiOCH forming the at least one of the first and second inorganic films 312 and 314 may be greater than the content of oxygen included in SiOCH forming the organic film 316. In addition, the content of carbon included in SiOCH forming the at least one of the first and second inorganic films 312 and 314 may be less than the content of carbon included in SiOCH forming the organic film 316.

The content of oxygen and carbon in SiOCH may be adjusted while SiOCH is prepared. For example, a SiOCH film is formed via PECVD by using a raw material gas, such as hexamethyldisiloxane, and a reaction gas, such as oxygen, and in this case, when a flow ratio of oxygen that is the reaction gas is increased, the content of oxygen may be increased and the content of carbon may be decreased in the SiOCH film.

As such, when the at least one of the first and second inorganic films 312 and 314 and the organic film 316 are formed of SiOCH, the first and second inorganic films 312 and 314 and the organic film 316 may be continuously formed in the same chamber by only adjusting the flow of the reaction gas, and thus manufacturing efficiency and yield of the encapsulation layer 310 may increase.

In addition, the first and second inorganic films 312 and 314 may have greater areas than the organic film 316. Accordingly, the first and second inorganic films 312 and 314 may contact each other outside the organic film 316, and accordingly, penetration of external oxygen and moisture may be further effectively prevented. In addition, as shown in FIG. 8, at least one of the first inorganic film 312 and the second inorganic film 314 may contact a side surface of the island 101. Accordingly, penetration of external moisture may be further effectively prevented, and an adhesive force of the encapsulation layer 310 may increase.

Figure 9:
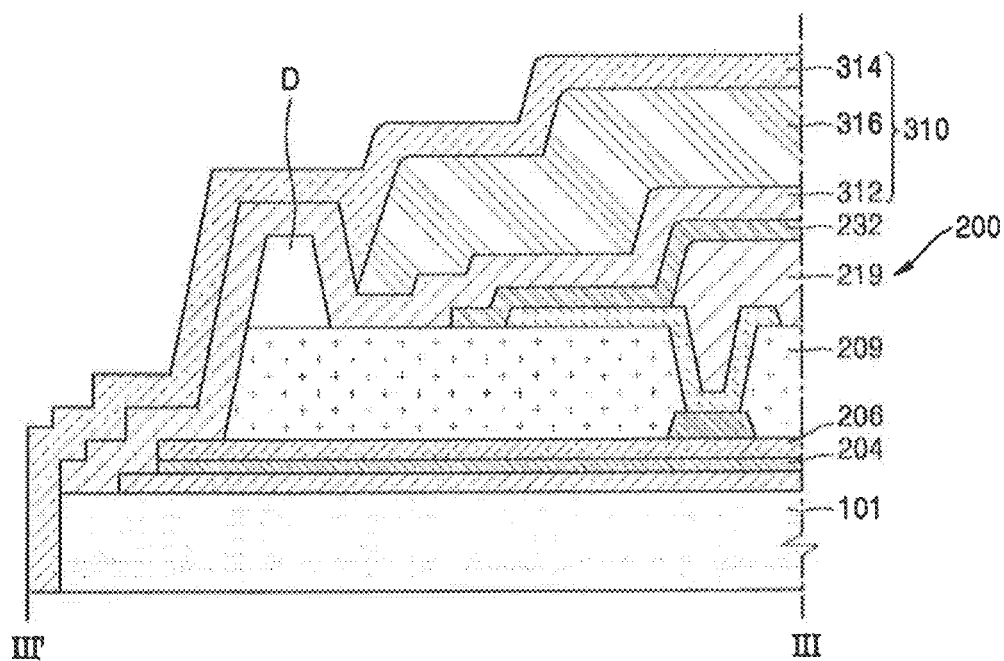
FIG. 9 is a cross-sectional view taken along the line III-III' of FIG. 3, according to an exemplary embodiment of the inventive concept.

FIG. 9 is a cross-sectional view taken along the line of FIG. 3, according to an exemplary embodiment of the inventive concept.

Referring to FIGS. 3 and 9, the display unit 200 and the encapsulation layer 310 are located over the island 101. Since the island 101 and the display unit 200 are the same as those described above with reference to FIGS. 1 through 6, details thereof are not provided again and only differences will now be described.

The encapsulation layer 310 may be formed over each island 101 to seal each display unit 200. The encapsulation layer 310 may include, for example, the first and second inorganic films 312 and 314 and the organic film 316, which are alternately stacked on each other. In FIG. 9, the encapsulation layer 310 includes two inorganic films, e.g., the first and second inorganic films 312 and 314, and one organic film, e.g., the organic film 316, but the inventive concept is not limited thereto. In other words, the encapsulation layer 310 may further include additional inorganic films and additional organic films, which are alternately stacked on each other, and the numbers of the inorganic films and organic films stacked on each other are not limited. In addition, as described with reference to FIG. 4, the encapsulation layer 310 may be formed of an LVT inorganic material or may further include a layer formed of an LVT inorganic material.

A dam portion D surrounding at least a part of the display region DA may be formed in the non-display region of the display unit 200.

The dam portion D blocks an organic material used in the forming of the organic film 316 from flowing towards an edge of the island 101, thereby preventing forming of an edge tail of the organic film 316. Accordingly, the organic film 316 may face or contact an inner side surface of the dam portion D. As another example, the organic film 316 may partially overlap the dam portion D but does not extend beyond the dam portion D.

The first and second inorganic films 312 and 314 may cover the dam portion D and end portions of the first and second inorganic films 312 and 314 may be disposed closer to the edge of the island 101 than the dam portion D to contact the interlayer insulating layer 206. Accordingly, deterioration or removal of encapsulation characteristics of the encapsulation layer 310 caused when edges of the first and second inorganic films 312 and 314 are detached from the non-display region may be prevented.

The dam portion D may be formed by including the same material as at least one of the layers from the gate insulating layer 204 to the pixel defining layer 219 (e.g., one of layers 204, 206, 209, 219).

For example, the dam portion D may include a first layer formed of the same material as the passivation layer 209 and a second layer formed of the same material as the pixel defining layer 219 and disposed on the first layer. However, the inventive concept is not limited thereto, and the dam portion D may include one layer. In addition, the number of dam portions D may be at least two. When there are a plurality of the dam portions D, heights of the dam portions D may increase towards an outer region of the island 101.

Figure 10:
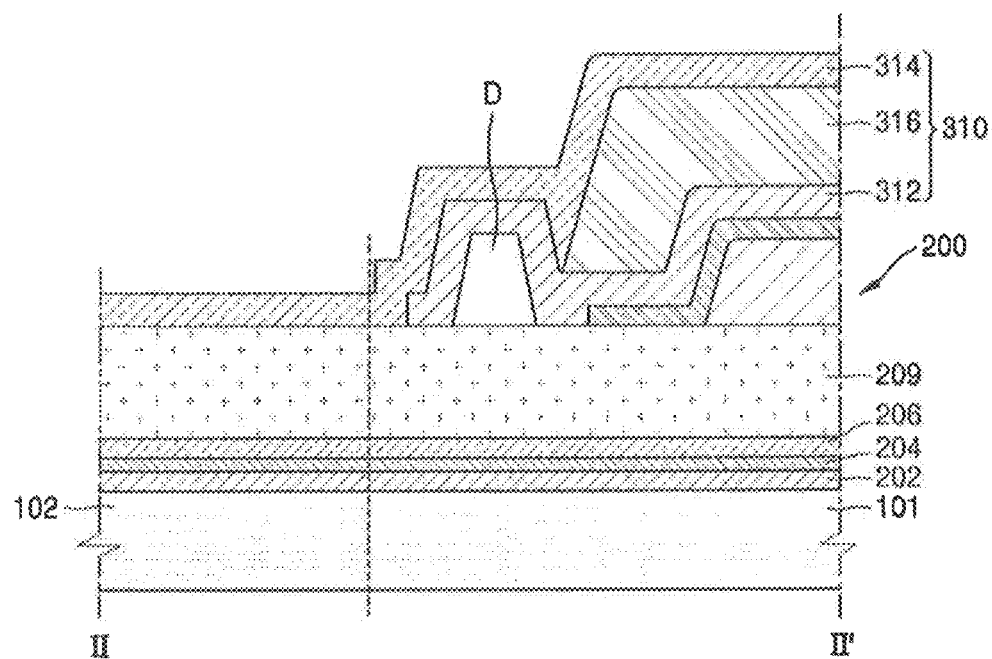
FIG. 10 is a cross-sectional view taken along the line of FIG. 3, according to an exemplary embodiment of the inventive concept.

FIG. 10 is a cross-sectional view taken along the line of FIG. 3, according to an exemplary embodiment of the inventive concept.

Referring to FIGS. 3 and 10, the display unit 200 is located over the island 101, and the display unit 200 may be sealed by the encapsulation layer 310. The dam portion D surrounding at least a part of the display region DA may be formed in the non-display region of the display unit 200.

The encapsulation layer 310 may include the first and second films 312 and 314 and the organic film 316, which are alternately stacked on each other. Here, the organic film 316 may face or contact the inner side surface of the dam portion D or may partially overlap the dam portion D, but does not extend beyond the dam portion D. The first and second inorganic films 312 and 314 cover the dam portion D and may contact each other beyond the dam portion D.

In addition, the buffer layer 202, the gate insulating layer 204, the interlayer insulating layer 206, and the passivation layer 209 of the display unit 200 may also be formed over the connection unit 102, and the second inorganic film 314 may extend over the connection unit 102. In other words, the passivation layer 209 located over the connection unit 102 may be covered by the second inorganic film 314. As described above, since the passivation layer 209 may be formed of an organic material, when the second inorganic film 314 formed of an inorganic material covers the passivation layer 209 over the connection unit 102, a surface of the passivation layer 209 is not exposed to oxygen or moisture, and thus oxygen or moisture is blocked from penetrating into the display unit 200 through the passivation layer 209.

Figure 11:
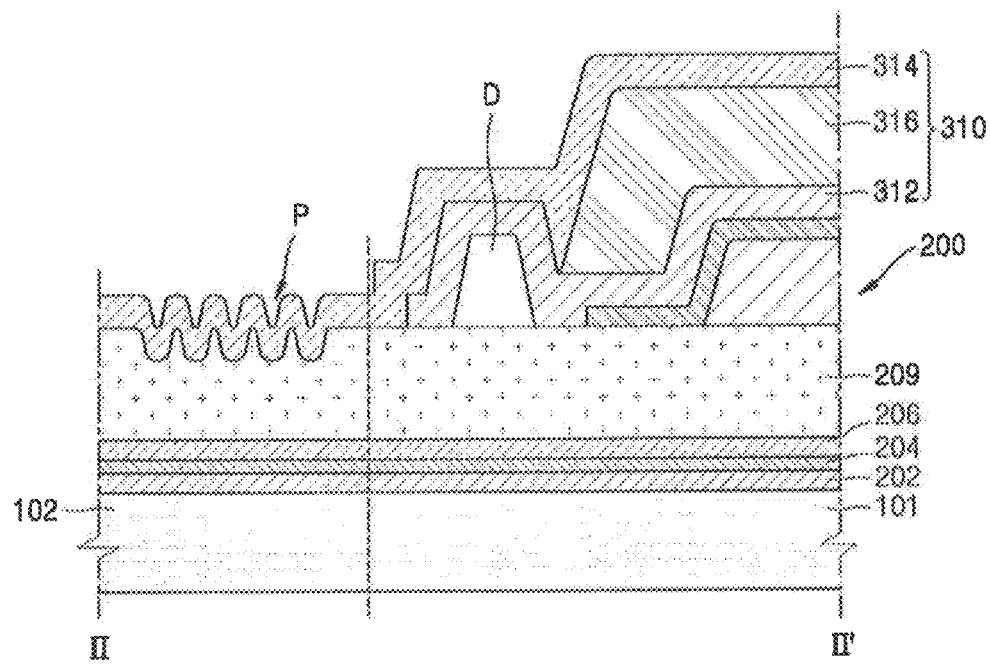
FIG. 11 is a cross-sectional view taken along the line of FIG. 3, according to an exemplary embodiment of the inventive concept.

FIG. 11 is a cross-sectional view taken along the line II-II' of FIG. 3, according to an exemplary embodiment of the inventive concept.

Referring to FIGS. 3 and 11, the display unit 200 is located over the island 101, and the display unit 200 may be sealed by the encapsulation layer 310. The dam portion D surrounding at least a part of the display region DA may be formed in the none display region of the display unit 200.

The encapsulation layer 310 may include the first and second inorganic films 312 and 314 and the organic film 316, which are alternately stacked on each other. Here, the organic film 316 may face or contact the inner side surface of the dam portion D or may partially overlap the dam portion D, but does not extend beyond the dam portion D. The first and second inorganic films 312 and 314 cover the dam portion D, and contact each other beyond the dam portion D.

The buffer layer 202, the gate insulating layer 204, the interlayer insulating layer 206, and the passivation layer 209 of the display unit 200 are formed over the connection unit 102, and the passivation layer 209 may be covered by the second inorganic film 314 extending over the connection unit 102.

In addition, a flexure portion P may be formed at least partly over the connection unit 102. For example, the flexure portion P may be formed by patterning the passivation layer 209. As another example, the flexure portion P may be formed by forming a stepped portion in the connection unit 102. As such, a method of forming the flexure portion P may vary and is not limited.

The flexure portion P may be formed at a location corresponding to a connecting region of the island 101 and the connection unit 102. In other words, where the island 101 and the connection unit 102 meet. Accordingly, when the display device 10 of FIG. 1 is elongated, the flexure portion P reduces stress that is concentrated in the connecting region of the island 101 and the connection unit 102 and prevents the inorganic film 314 extending over the connection unit 102 from being damaged, for example, from being cracked.

Figure 12:
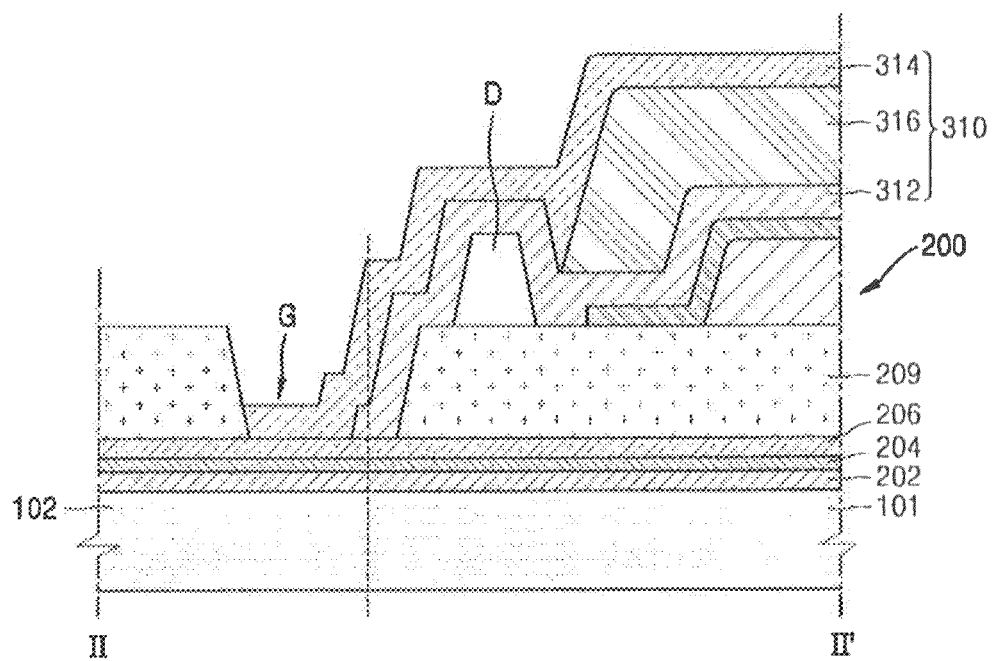
FIG. 12 is a cross-sectional view taken along the line II-II' of FIG. 3, according to an exemplary embodiment of the inventive concept.

FIG. 12 is a cross-sectional view taken along the line II-II' of FIG. 3, according to an exemplary embodiment of the inventive concept.

Referring to FIGS. 3 and 12, the display unit 200 is located over the island 101, and the display unit 200 may be sealed by the encapsulation layer 310. The dam portion D surrounding at least a part of the display region DA may be formed in the non-display region of the display unit 200.

The buffer layer 202, the gate insulating layer 204, the interlayer insulating layer 206, and the passivation layer 209 of the display unit 200 may be formed over the connection unit 102. In addition, a disconnection region G may be formed over the connection unit 102 in the passivation layer 209. The disconnection region G may expose an inorganic layer therebelow. The inorganic layer may be one of the gate insulating layer 204 and the interlayer insulating layer 206. The disconnection region G may be formed to cross the connection unit 102 in a width direction of the connection unit 102.

In addition, the encapsulation layer 310 may include the first and second inorganic films 312 and 314 and the organic film 316, which are alternately stacked on each other. Here, the organic film 316 may face or contact the inner side surface of the dam portion D or may partially overlap the dam portion D, but does not extend beyond the dam portion D. The first and second inorganic films 312 and 314 may cover the dam portion D and extend beyond the dam portion D to contact an inorganic layer of the display unit 200.

In addition, the first inorganic film 312 and the second inorganic film 314 contact each other at an outer region of the dam portion D (in other words, a region beyond the dam portion D), and at least one of the first and second inorganic films 312 and 314 may contact an inorganic layer exposed through the disconnection region G. Accordingly, the first and second inorganic films 312 and 314 of the encapsulation layer 310 may contact another inorganic layer in an entire outer region of the display unit 200.

For example, as shown in FIG. 12, when the first and second inorganic films 312 and 314 contact the interlayer insulating layer 206 through the disconnection region G, the first or second inorganic film 312 or 314 contacts the interlayer insulating layer 206 over the island 101 as shown in FIG. 9, and thus the display unit 200 is completely encapsulated by the first and second inorganic films 312 and 314 of the encapsulation layer 310 and the interlayer insulating layer 206 to have an isolated state. Accordingly, penetration of external moisture and/or external oxygen may be effectively prevented.

Figure 13:
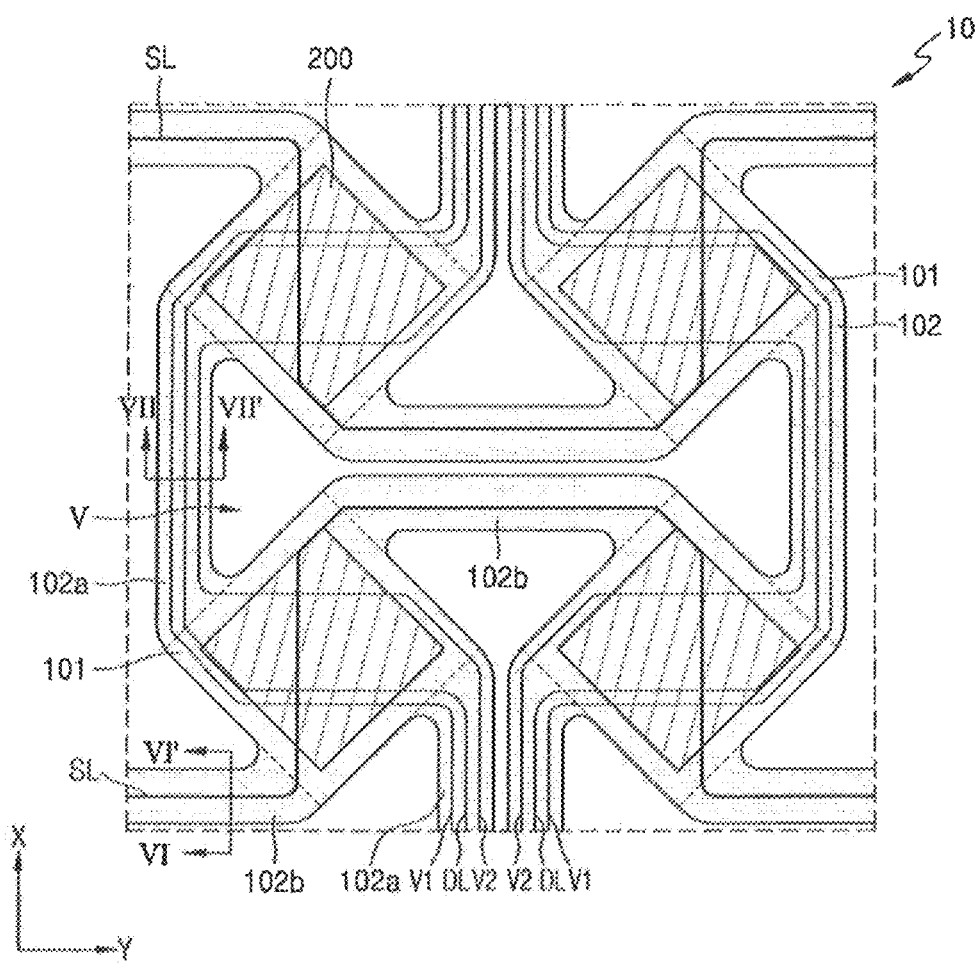
FIG. 13 is an enlarged plan view of the region A of FIG. 1, according to an exemplary embodiment of the inventive concept.
Figure 14:
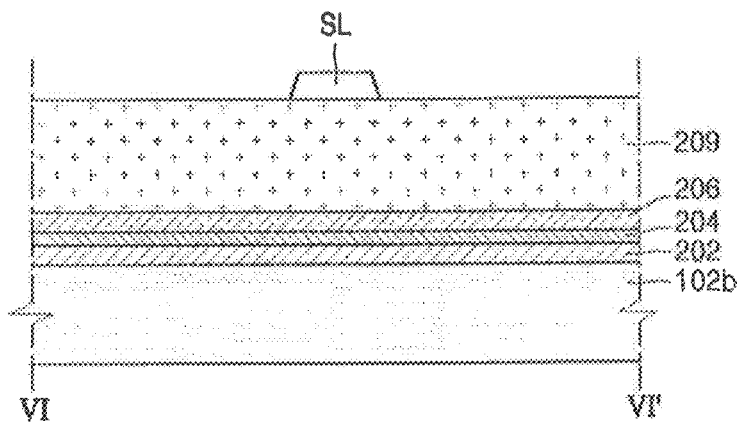
FIG. 14 is a cross-sectional view taken along a line VI-VI' of FIG. 13, according to an exemplary embodiment of the inventive concept.
Figure 15:
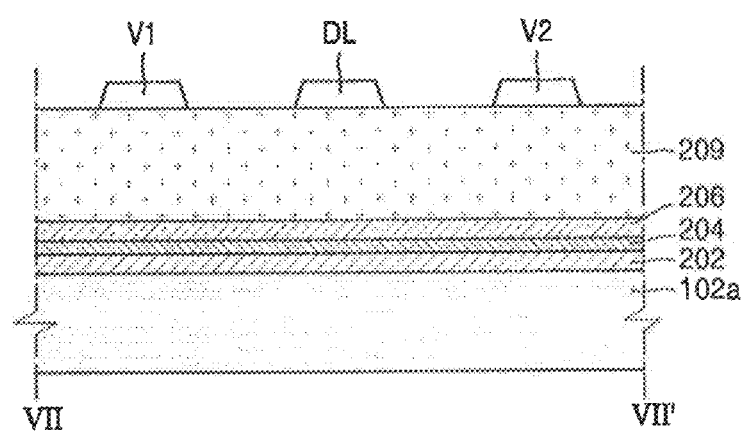
FIG. 15 is a cross-sectional view taken along a line VII-VII' of FIG. 13, according to an exemplary embodiment of the inventive concept.

FIG. 13 is an enlarged plan view of the region A of FIG. 1, according to an exemplary embodiment of the inventive concept, FIG. 14 is a cross-sectional view taken along a line VI-VI' of FIG. 13, according to an exemplary embodiment of the inventive concept, and FIG. 15 is a cross-sectional view taken along a line VII-VII' of FIG. 13, according to an exemplary embodiment of the inventive concept.

Referring to FIG. 13, the display device 10 may include the plurality of islands 101, the plurality of connection units 102 connecting the plurality of islands 101, and the plurality of display units 200 respectively disposed over the plurality of islands 101. In addition, the plurality of display units 200 may each be sealed by an encapsulation layer.

Each of the display units 200 may form a sub-pixel by including one OLED 230 of FIG. 4 for emitting red, blue, green, or white light. As another example, each of the display units 200 may include a plurality of the OLEDs 230 for emitting different colors of light. For example, one display unit 200 may include the OLED 230 for emitting red light, the OLED 230 for emitting green light, and the OLED 230 for emitting blue light to form one pixel. As another example, the display unit 200 may include a plurality of pixels.

In addition, the OLEDs 230 in the display unit 200 may be disposed in any one of various arrangements, such as a RBG structure, a pentile structure, and a honeycomb structure. Such arrangement may depend on the efficiency of materials included in an organic emission layer.

In addition, four connection units 102 are connected to one island 101. For example, the island 101 may include the pair of first connection units 102a located opposite to each other and extending in a direction parallel to the first direction X, and the pair of second connection units 102b located opposite to each other and extending in a direction parallel to the second direction Y.

A first wiring portion may be located over the pair of first connection units 102a and a second wiring portion may be located over the pair of second connection units 102b. For example, the first wiring portion may include a first voltage line V1, the second voltage line V2, and at least one data line DL, and the second wiring portion may include at least one scan line SL.

The first and second wiring portions may cross each other over the island 101.

The first wiring portion may extend along the first direction X and include a region protruding and curved in a direction parallel to the second direction Y around the penetration portion V. In other words, since the first wiring portion may extend in the first direction X and repeatedly have a curved shape at regular intervals, luminance non-uniformity between the display units 200 caused by the first wiring portion may be reduced or prevented. In addition, by forming a plurality of the first wiring portions extending in the same direction such that the first wiring portions do not overlap each other, interference therebetween may be reduced.

Since the second wiring portion may extend along the second direction Y and repeatedly have a region protruding and curved in a direction parallel to the first direction X, luminance non-uniformity between the display units 200 caused by the second wiring portion may be reduced or prevented. In addition, the second wiring portions extending in the same direction may not overlap each other to reduce interference therebetween.

In addition, the first and second wiring portions may include the same material. For example, the first and second wiring portions may be formed of the same material as the source and drain electrodes 207 and 208 having excellent flexibility and a stacked structure of Ti/Al/Ti.

FIG. 14 illustrates an example in which the scan line SL is formed over the second connection unit 102b. The buffer layer 202, the gate insulating layer 204, the interlayer insulating layer 206, and the passivation layer 209 may be sequentially stacked over the second connection unit 102b, and the scan line SL may be formed over the passivation layer 209. Since the scan line SL is connected to a gate electrode of a thin-film transistor so as to apply a scan signal to the thin-film transistor, the gate electrode of the thin-film transistor and the scan line SL may be electrically connected to each other through a contact hole.

FIG. 15 illustrates an example in which the first voltage line V1, the data line DL, and the second voltage line V2 are formed over the first connection unit 102a. The buffer layer 202, the gate insulating layer 204, the interlayer insulating layer 206, and the passivation layer 209 may be sequentially stacked over the first connection unit 102a, and the first voltage line V1, the data line DL, and the second voltage line V2 may be formed over the passivation layer 209.

The data line DL may be connected to a drain electrode of the thin-film transistor to apply a data signal to the thin-film transistor. The first voltage line V1 may be included in each of the display units 200 to electrically connect the first electrode 231 of FIG. 4 that are separated from each other to each other.

In addition, according to an exemplary embodiment of the inventive concept, since the display units 200 each include the second electrodes 232 of FIG. 4 that are separated from each other, the second voltage line V2 may be formed in the same or similar pattern as the first voltage line V1 to electrically connect the second electrodes 232 of FIG. 4 to each other, and the second voltage line V2 may be electrically connected to the second electrode 232 of FIG. 4 through a contact hole.

Figure 16:
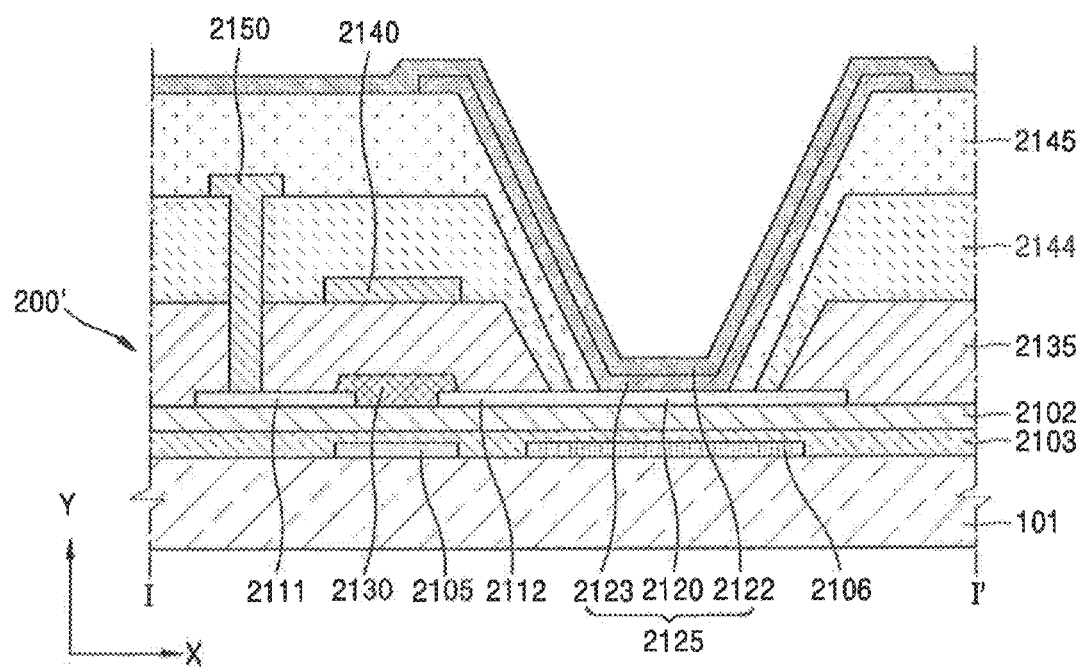
FIG. 16 is a cross-sectional view taken along the line of FIG. 3, according to an exemplary embodiment of the inventive concept.

FIG. 16 is a cross-sectional view taken along the line I-I' of FIG. 3, according to an exemplary embodiment of the inventive concept.

Referring to FIG. 16, a display unit 200' is located over the island 101, and the display unit 200' may include a source electrode 2111, a drain electrode 2112, an active layer 2130, an OLED 2125, a gate electrode 2140, an optical protection layer 2105, a color filter 2106, and an auxiliary electrode 2150. In addition, although an encapsulation layer is not illustrated over the display unit 200' in FIG. 16 for convenience of description, it is to be understood that the display unit 200' may be sealed by an encapsulation layer.

The island 101 may be formed of the same material described in one or more of the above embodiments. A buffer layer 2102 may be formed over the island 101.

The source electrode 2111 and the drain electrode 2112 may be formed over the buffer layer 2102. In addition, a first electrode 2120 of the OLED 2125 is formed over the buffer layer 2102. In other words, the first electrode 2120 may be formed by extending one of the source and drain electrodes 2111 and 2112. In other words, the first electrode 2120 may be formed of the same material as one of the source and drain electrodes 2111 and 2112, and may be integrally formed with one of the source and drain electrodes 2111 and 2112. Accordingly, process efficiency of the display unit 200' may increase.

The active layer 2130 is formed over the source electrode 2111 and the drain electrode 2112. The active layer 2130 may be formed to correspond to a space between the source and drain electrodes 2111 and 2112.

According to an exemplary embodiment of the inventive concept, the active layer 2130 may contact the source and drain electrodes 2111 and 2112, and in particular, may contact facing side surfaces from among regions of the source and drain electrodes 2111 and 2112. For example, the active layer 2130 may contact a side surface of the source electrode 2111, which faces the drain electrode 2112, and contact a side surface of the drain electrode 2112, which faces the source electrode 2111. According to an exemplary embodiment of the inventive concept, the active layer 2130 may contact regions of top surfaces of the source and drain electrodes 2111 and 2112. Accordingly, contact regions between the active layer 2130 and the source and drain electrodes 2111 and 2112 increase, and thus a short channel structure may be easily realized. In other words, a channel structure having a small size.

The active layer 2130 may be formed of various materials, and for example, may contain an oxide semiconductor material. According to an exemplary embodiment of the inventive concept, the active layer 2130 may contain a ZnO-based oxide. According to an exemplary embodiment of the inventive concept, the active layer 2130 may be formed of an oxide semiconductor material containing In, Ga, or Sn.

According to an exemplary embodiment of the inventive concept, the active layer 2130 may include G-I-Z-O [(In2O3)a(Ga2O3)b(ZnO)c], wherein a, b, and c are each a real number satisfying conditions of a≥0, b≥0, and c>0.

According to an exemplary embodiment of the inventive concept, the active layer 2130 may include an oxide of a material from among 12, 13, and 14-group metal elements, such as Zn, In, Ga, Sn, Cd, Ge, and Hf, and a combination thereof.

The gate electrode 2140 is formed to have a region overlapping at least the active layer 2130. In other words, the gate electrode 2140 and the active layer 2130 overlap each other in one region. The gate electrode 2140 may be formed of at least one of various materials having excellent conductivity. According to an exemplary embodiment of the inventive concept, the gate electrode 2140 may be formed of a low resistance metal material, and may include, for example, Mo, Al, Cu, or Ti.

A first insulating film 2135 is formed between the gate electrode 2140 and the active layer 2130. The gate electrode 2140 and the active layer 2130 are electrically insulated from each other by the first insulating film 2135.

The first insulating film 2135 is formed so as not to cover at least one region of the first electrode 2120. According to an exemplary embodiment of the inventive concept, the first insulating film 2135 may be formed to cover at least one region of an edge of the first electrode 2120.

The gate electrode 2140 is formed over the first insulating film 2135. The first insulating film 2135 may be formed of at least one of various insulating materials, for example, an inorganic material, such as silicon oxide, silicon nitride, or aluminum oxide, or as another example, an organic material of a polymer material.

A second insulating film 2144 is formed over the gate electrode 2140. The second insulating film 2144 is formed to cover the gate electrode 2140. The second insulating film 2144 is formed over the first insulating film 2135. The second insulating film 2144 is formed so as not to cover at least one region of the first electrode 2120.

According to an exemplary embodiment of the inventive concept, the second insulating film 2144 may be formed to cover the first insulating film 2135 in a region corresponding to a top surface of the first electrode 2120.

According to an exemplary embodiment of the inventive concept, at least a part of the first insulating film 2135 may not be covered by the second insulating film 2144 and may be exposed in the region corresponding to the top surface of the first electrode 2120.

The auxiliary electrode 2150 may be formed over the second insulating film 2144. The auxiliary electrode 2150 is formed to contact at least one of the source and drain electrodes 2111 and 2112. The first and second insulating films 2135 and 2144 are formed to expose at least one region of at least one of the source and drain electrodes 2111 and 2112, and the auxiliary electrode 2150 may be formed to contact such an exposed region.

The auxiliary electrode 2150 may not correspond to a region of the first electrode 2120, which is not covered by at least the first and second insulating films 2135 and 2144. For example, the auxiliary electrode 2150 may not be located over the first electrode 2120 in some cases.

The auxiliary electrode 2150 increases electric characteristics of the source and drain electrodes 2111 and 2112. In particular, when the source and drain electrodes 2111 and 2112 are formed of a light transmissive material, electric resistance of the source and drain electrodes 2111 and 2112 may be increased. Such increased electric resistance may be compensated for by forming the auxiliary electrode 2150 by using a material having a low resistivity, thereby increasing the electric characteristics of the source and drain electrodes 2111 and 2112.

The auxiliary electrode 2150 may be formed of at least one of various conductive materials, and for example, may be formed of a metal material having excellent conductivity. According to an exemplary embodiment of the inventive concept, the auxiliary electrode 2150 may contain Cu, Ag, Al, Mo, or Au. In addition, according to an exemplary embodiment of the inventive concept, the auxiliary electrode 2150 may be spaced apart from the active layer 2130 such that components of the auxiliary electrode 2150 are diffused towards the active layer 2130, thereby preventing the active layer 2130 from being damaged.

In other words, the auxiliary electrode 2150 may be formed in a layer different from the gate electrode 2140, e.g., over the second insulating film 2144 to reduce interference with the gate electrode 2140 and to precisely pattern the gate electrode 2140 and the auxiliary electrode 2150. However, according to an exemplary embodiment of the inventive concept, the auxiliary electrode 2150 may be formed over the first insulating film 2135, e.g., on the same layer as the gate electrode 2140.

A third insulating film 2145 is formed over the second insulating film 2144. The third insulating film 2145 is formed to cover the auxiliary electrode 2150. The third insulating film 2145 may be formed so as not to cover at least one region of the first electrode 2120.

According to an exemplary embodiment of the inventive concept, the third insulating film 2145 may be formed to cover the second insulating film 2144 in a region corresponding to the top surface of the first electrode 2120. In other words, above the first electrode 2120. According to an exemplary embodiment of the inventive concept, at least a part of the second insulating film 2144 may not be covered by the third insulating film 2145 and may be exposed in the region corresponding to the top surface of the first electrode 2120.

An intermediate layer 2123 is formed on the top surface of the first electrode 2120. The intermediate layer 2123 may include an organic emission layer to generate visible light. Light generated by the intermediate layer 2123 may have various colors, such as red, green, and blue. According to an exemplary embodiment of the inventive concept, the intermediate layer 2123 may generate white light.

A second electrode 2122 is formed over the intermediate layer 2123. The second electrode 2122 may be formed of at least one of various conductive materials, such as Li, Ca, LiF/Ca, LiF/Al, Al, Mg, and Ag.

The optical protection layer 2105 is formed to correspond to the active layer 2130. The optical protection layer 2105 may be formed to face a surface of the active layer 2130, which is opposite to a surface of the active layer 2130 facing the gate electrode 2140. Accordingly, the active layer 2130 may be prevented from being damaged by light.

According to an exemplary embodiment of the inventive concept, an over-coating layer 2103 may be formed over a substrate to cover the optical protection layer 2105. As shown in FIG. 16, the substrate may be the island 101, for example. The over-coating layer 2103 may be formed below the buffer layer 2102.

The color filter 2106 is formed to correspond to at least one region of the first electrode 2120. For example, the color filter 2106 may be formed to correspond to a region of the first electrode 2120, which overlaps the intermediate layer 2123. The color filter 2106 may be disposed between the first electrode 2120 and the substrate.

According to an exemplary embodiment of the inventive concept, the color filter 2106 may be formed over the substrate, and the over-coating layer 2103 may be formed to cover the color filter 2106. The cover-coating layer 2103 may be formed below the buffer layer 2102.

The color filter 2106 may be formed to correspond to the first electrode 2120, and thus a display device for generating various colors may be easily realized.

While forming the color filter 2106, the optical protection layer 2105 may be simultaneously formed by using a color filter material of one color, for example, red. In other words, after forming the optical protection layer 2105 and the color filter 2106 over the substrate, the over-coating layer 2103 may be formed to cover the optical protection layer 2105 and the color filter 2106.

Figure 17:
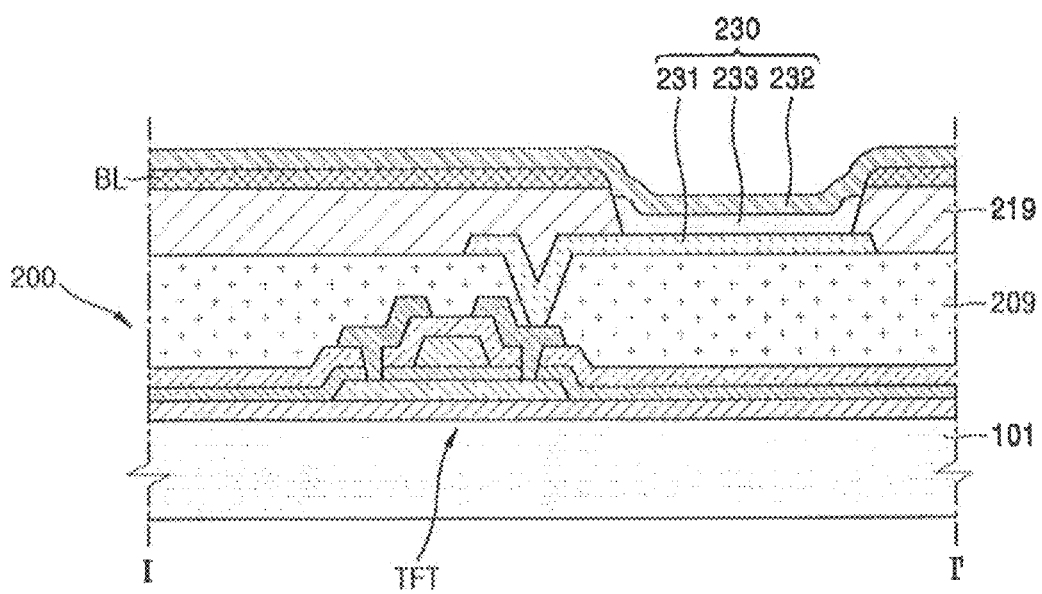
FIG. 17 is a cross-sectional view taken along the line I-I' of FIG. 3, according to an exemplary embodiment of the inventive concept.

FIG. 17 is a cross-sectional view taken along the line I-I' of FIG. 3, according to an exemplary embodiment of the inventive concept.

Referring to FIGS. 3 and 17, the display unit 200 is located over the island 101, and the display unit 200 may include at least one OLED 230 and the thin-film transistor TFT electrically connected to the OLED 230. The OLED 230 may include the first electrode 231, the intermediate layer 233, and the second electrode 232, and the passivation layer 209 may be located between the OLED 230 and the thin-film transistor TFT. In addition, although an encapsulation layer is not illustrated over the display unit 200 in FIG. 17, for convenience of description, it is to be understood that the display unit 200 may be sealed by an encapsulation layer.

The pixel defining layer 219 defines a pixel region of the OLED 230 by exposing a certain region of the first electrode 231. A light blocking layer BL may be disposed in regions excluding the pixel region defined by the pixel defining layer 219.

For example, when the display unit 200 is a top emission type, the light blocking layer BL may be formed on a top surface of the pixel defining layer 219. However, the inventive concept is not limited thereto, and the pixel defining layer 219 or the passivation layer 209 may include a material for blocking light. In addition, when the display unit 200 is a bottom emission type, the light blocking layer BL may be disposed between the island 101 and the thin-film transistor TFT.

Figure 18:
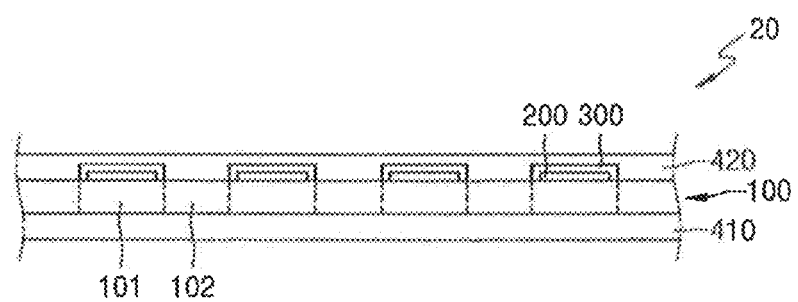
FIG. 18 is a cross-sectional view of a display device according to an exemplary embodiment of the inventive concept.

FIG. 18 is a cross-sectional view of a display device 20 according to an exemplary embodiment of the inventive concept.

Referring to FIG. 18, the display device 20 may include: the substrate 100 including the plurality of islands 101 and the connection units 102 connecting the plurality of islands 101; the plurality of display units 200 respectively arranged over the plurality of islands 101; the plurality of encapsulation layers 300 respectively encapsulating the plurality of display units 200; and first and second protection films 410 and 420 respectively disposed over top and bottom surfaces of the substrate 100. In addition, the substrate 100 may include a plurality of the penetration portions V of FIG. 1 penetrating through the substrate 100, between the connection units 102.

Since the substrate 100, the display unit 200, and the encapsulation layer 300 are the same as those described above, details thereof are not provided again.

The first and second protection films 410 and 420 may prevent external impurities from penetrating into the display device 20. The first and second protection films 410 and 420 are formed of an elongated sheet, and accordingly, when the display device 20 is elongated or deformed, the first and second protection films 410 and 420 may also stretched and deformed. For example, the first and second protection films 410 and 420 may be a biaxial oriented polypropylene film or a biaxial oriented polyethyleneterephthlate film. According to an exemplary embodiment of the inventive concept, the first and second protection films 410 and 420 may include PDMS, but are not limited thereto.

Figure 19:
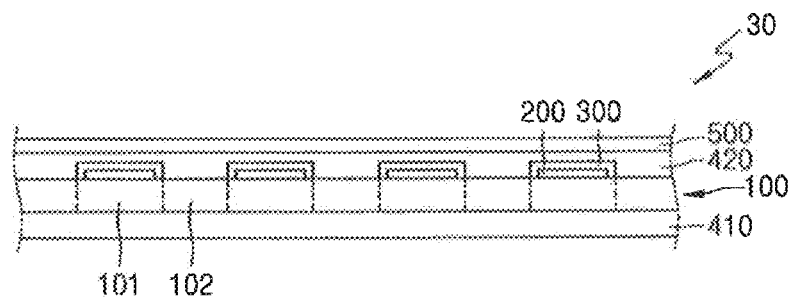
FIG. 19 is a cross-sectional view of a display device according to an exemplary embodiment of the inventive concept.

FIG. 19 is a cross-sectional view of a display device 30 according to an exemplary embodiment of the inventive concept.

Referring to FIG. 19, the display device 30 may include: the substrate 100; the plurality of display units 200 disposed over the substrate 100; the plurality of encapsulation layers 300 respectively encapsulating the plurality of display units 200; the first and second protection films 410 and 420 respectively disposed over top and bottom surfaces of the substrate 100; and a functional layer 500 over the second protection film 420.

The substrate 100 includes the plurality of islands 101 and the connection units 102 connecting the plurality of islands 101, and may include the plurality of penetration portions V of FIG. 1 penetrating through the substrate 100 between the connection units 102.

The plurality of display units 200 may be respectively disposed over the plurality of islands 101, and the encapsulation layers 300 respectively encapsulating the plurality of display units 200 may also be respectively disposed over the plurality of islands 101.

As described above with reference to FIG. 18, the first and second protection films 410 and 420 may prevent external impurities from penetrating into the display device 30.

The functional layer 500 may include at least one of a polarization layer or a touch screen layer. In addition, the functional layer 500 may further include an optical film for external light reflection, and a protection layer. The functional layer 500 is extendable, and may be elongated when the display device 30 is bent, for example.

Figure 20:
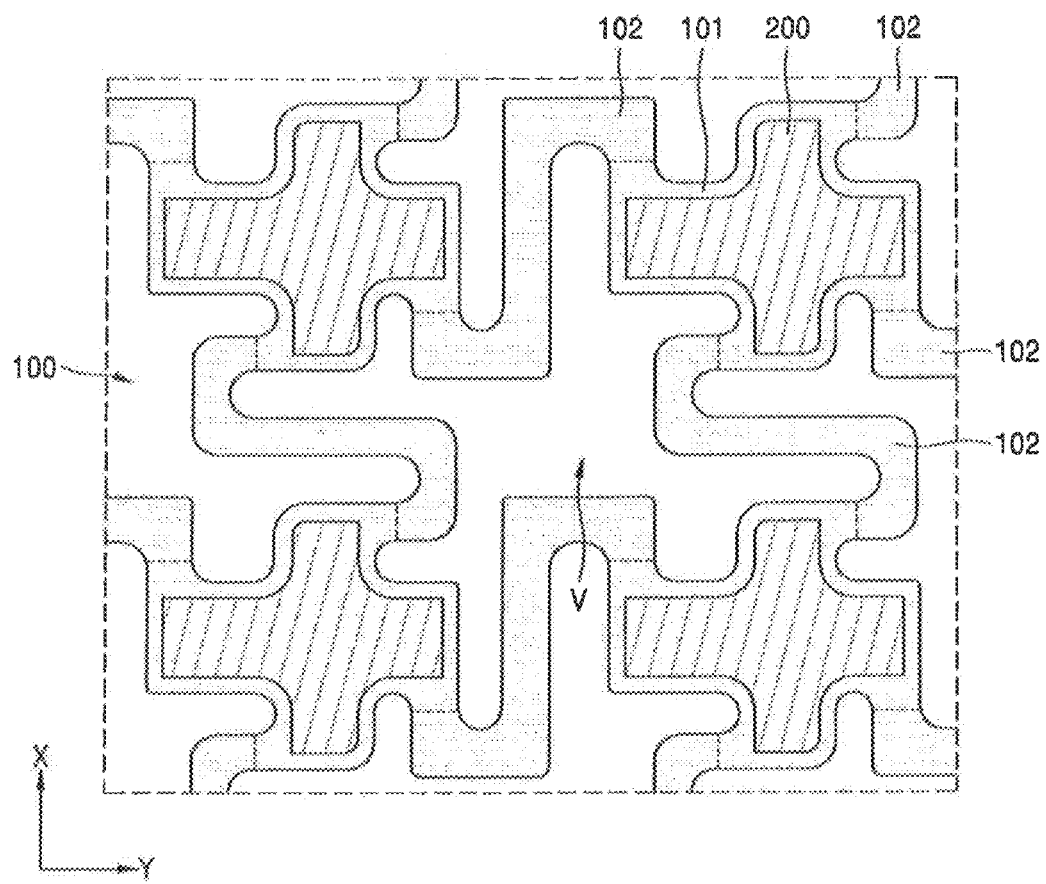
FIG. 20 is an enlarged plan view of the region A of FIG. 1, according to an exemplary embodiment of the inventive concept.

FIG. 20 is an enlarged plan view of the region A of FIG. 1, according to an exemplary embodiment of the inventive concept.

Referring to FIG. 20, the substrate 100 may include the plurality of islands 101 spaced apart from each other, the plurality of connection units 102 connecting the plurality of islands 101, and the plurality of penetration portions V penetrating through the substrate 100 between the plurality of connection units 102.

The plurality of display units 200 may be respectively disposed over the plurality of islands 101. An individual display unit 200 may include at least a display element to realize visible light. The display element may be an OLED.

The plurality of display units 200 may be independently sealed by an encapsulation layer.

The plurality of connection units 102 may connect the plurality of islands 101 to each other. For example, four connection units 102 are connected to each island 101. The four connection units 102 connected to one island 101 may extend in different directions and be disposed adjacent to the one island 101 to be respectively connected to four other islands 101 surrounding the one island 101. Wiring portions electrically connected to the display unit 200 may be located over the plurality of islands 101.

The islands 101 and the connection units 102 may be continuously formed by using the same material. In other words, the islands 101 and the connection units 102 may be integrally formed.

In addition, referring to FIG. 20, the connection unit 102 includes at least one flexure portion. Accordingly, when the substrate 100 is stretched, a shape of the flexure portion may change and intervals between the islands 101 may increase, and thus a shape of the display device 10 of FIG. 1 may change in 2D or 3D.

The penetration portions V are formed to penetrate through the substrate 100. The penetration portion V provides an isolated region between the islands 101, reduces a weight of the substrate 100, and may increase flexibility of the substrate 100. In addition, when the substrate 100 is twisted, bent, or rolled, shapes of the penetration portions V also change, thereby reducing stress that is generated when the substrate 100 is deformed. Accordingly, abnormal deformation of the substrate 100 may be prevented and durability of the substrate 100 may be increased. Accordingly, user convenience may be increased by using the display device 10, and the display device 10 may be easily applied to a bending display device, a flexible display device, or a stretchable display device.

According to one or more of the exemplary embodiments described herein, an encapsulation layer is prevented from being damaged when a shape of a display device is changed, thereby increasing reliability of the display device.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A display device, comprising:
a plurality of unit portions repeatedly arranged in a first direction and a second direction, wherein the second direction is different from the first direction;
a plurality of display units respectively arranged above the plurality of unit portions; and
a plurality of encapsulation layers respectively encapsulating the plurality of display units,
wherein each of the plurality of unit portions comprises an island where a display unit and an encapsulation layer are located, and at least one connection unit connected to the island, and
islands of two unit portions adjacent to each other are spaced apart from each other, and connection units of the two unit portions adjacent to each other are connected to each other,
wherein each of the plurality of encapsulation layers comprises a first inorganic film, a second inorganic film, and an organic film between the first and second inorganic films,
wherein each of the plurality of display units comprises a thin-film transistor comprising at least one inorganic layer, a display element electrically connected to the thin-film transistor, and a passivation layer between the thin-film transistor and the display element,
wherein the at least one inorganic layer and the passivation layer extend above the at least one connection unit, and
wherein the passivation layer comprises a groove and the second inorganic film covers at least a portion of the groove.

2. The display device of claim 1, wherein a closed curve is formed between four unit portions adjacent to each other, and
the closed curve defines an isolated region.

3. The display device of claim 2, wherein the isolated region contacts islands of the four unit portions.

4. The display device of claim 1, wherein each of the plurality of unit portions comprises four connection units, and
four connection units comprised in one unit portion extend in different directions to be respectively connected to four other unit portions surrounding the one unit portion.

5. The display device of claim 1, wherein the island and the at least one connection unit of at least one of the unit portions include a same material.

6. The display device of claim 1, wherein two unit portions adjacent to each other are symmetrical.

7. The display device of claim 1, wherein in each of the unit portions the island comprises at least one side surface to which the at least one connection unit is connected, and
an extending direction of the at least one connection unit and the at least one side surface to which the at least one connection unit is connected form an acute angle.

8. The display device of claim 7, wherein a connecting region of the at least one connection unit and the at least one side surface comprises a curved surface.

9. The display device of claim 1, wherein the plurality of encapsulation layers comprise tin fluorophosphates glass, chalcogenide glass, tellurite glass, borate glass, or phosphate glass.

10. The display device of claim 1, wherein at least one of the first inorganic film and the second inorganic film contacts a side surface of the island of one of the unit portions.

11. The display device of claim 1, wherein the organic film comprises silicon oxide containing carbon and hydrogen.

12. The display device of claim 1, wherein each of the plurality of display units comprises a display region and a non-display region outside the display region and a dam portion surrounding at least a part of the display region is located in the non-display region, and
the first inorganic film and the second inorganic film cover the dam portion and contact each other outside the dam portion.

13. The display device of claim 1, wherein the second inorganic film extends above the at least one connection unit.

14. The display device of claim 13, wherein the groove forms a flexure portion above the at least one connection unit.

15. The display device of claim 1, wherein the groove forms a disconnection region that exposes the at least one inorganic layer, and
- at least one of the first inorganic film and the second inorganic film contacts the at least one inorganic layer through the disconnection region.

16. The display device of claim 1, wherein the at least one connection unit comprises a pair of first connection units that are located opposite to each other and extend in a direction parallel to the first direction, and a pair of second connection units that are located opposite to each other and extend in a direction parallel to the second direction,
- a first wiring portion is located above the pair of first connection units and a second wiring portion is located above the pair of second connection units, and
- the first wiring portion and the second wiring portion cross each other above the island of one of the unit portions.

17. The display device of claim 16, wherein the first wiring portion and the second wiring portion comprise a same material.

18. The display device of claim 17, wherein each of the plurality of display units comprises a display element and a thin-film transistor electrically connected to the display element,
- the thin-film transistor comprises an active layer, a gate electrode, a source electrode, and a drain electrode, and
- the source electrode, the drain electrode, the first wiring portion, and the second wiring portion comprise a same material.

19. The display device of claim 18, wherein the first wiring portion comprises a first voltage line, a second voltage line, and at least one data line, and the second wiring portion comprises at least one scan line.

20. The display device of claim 19, wherein each of the plurality of display units comprises a display element comprising a first electrode, a second electrode, and an intermediate layer comprising an organic emission layer between the first and second electrodes,
- the first voltage line electrically connects first electrodes respectively comprised in the plurality of display units and separated from each other to each other, and
- the second voltage line electrically connects second electrodes respectively comprised in the plurality of display units and separated from each other to each other.

21. The display device of claim 1, wherein each of the plurality of display units comprises a display element and a thin-film transistor electrically connected to the display element,
- the thin-film transistor comprises an active layer, a gate electrode, a source electrode, and a drain electrode, and the display element comprises a first electrode, a second electrode, and an intermediate layer comprising an organic emission layer between the first and second electrodes,
- the first electrode extends from the source electrode or the drain electrode, and
- each of the plurality of display units further comprises a color filter that is disposed between the first electrode and the island of one of the unit portions and comprises a region overlapping the first electrode.

22. A flexible display device, comprising:
- a substrate comprising a first island, a second island spaced apart from the first island and a connection unit connecting the first island and the second island;
- display units respectively disposed on the first island and the second island; and
- encapsulation layers respectively encapsulating the plurality of display units;
- wherein each of the encapsulation layers comprises a first inorganic film, a second inorganic film, and an organic film between the first and second inorganic films,
- wherein each of the plurality of display units comprises a thin-film transistor comprising at least one inorganic layer, a display element electrically connected to the thin-film transistor, and a passivation layer between the thin-film transistor and the display element,
- wherein the at least one inorganic layer and the passivation layer extend above the connection unit,
- wherein the passivation layer comprises a disconnection region exposing at least one inorganic layer, and
- wherein at least one of the first inorganic film and the second inorganic film contacts the at least one inorganic layer through the disconnection region.

23. The flexible display device of claim 22, wherein the first and second islands and the connection unit are integrally formed.

24. The flexible display device of claim 22, wherein at least one of the first inorganic film and the second inorganic film contacts a side surface of a corresponding one of the first and second islands.

25. The flexible display device of claim 22, wherein the second inorganic film extends above the connection unit.

26. The flexible display device of claim 22, wherein the disconnection region crosses the connection unit in a width direction of the connection unit.

27. The flexible display device of claim 22, wherein each of the display units comprises a display region and a non-display region outside the display region, wherein a dam portion surrounding at least a part of the display region is located in the non-display region, and
- the first inorganic film and the second inorganic film cover the dam portion and contact each other beyond the dam portion.

28. A flexible display device, comprising:
- a substrate comprising a first island, a second island spaced apart from the first island and a connection unit connecting the first island and the second island;
- display units respectively disposed on the first island and the second island; and
- encapsulation layers respectively encapsulating the plurality of display units;
- wherein each of the encapsulation layers comprises a first inorganic film, a second inorganic film, and an organic film between the first and second inorganic films,
- wherein each of the display units comprises a thin-film transistor comprising at least one inorganic layer, a display element electrically connected to the thin-film transistor, and a passivation layer between the thin-film transistor and the display element,
- wherein the at least one inorganic layer and the passivation layer extend above the connection unit,
- wherein a flexure portion is formed at least partly above the connection unit and at least one of the first inorganic film and the second inorganic film covers the flexure portion.

* * * * *